US012727328B2

(12) United States Patent
Yang et al.

(10) Patent No.: US 12,727,328 B2
(45) Date of Patent: Sep. 1, 2026

(54) DISPLAY APPARATUS AND METHOD OF PROVIDING THE SAME

(71) Applicant: Samsung Display Co., Ltd., Yongin-si (KR)

(72) Inventors: Heesung Yang, Yongin-si (KR); Joonhwa Bae, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 765 days.

(21) Appl. No.: 17/747,461

(22) Filed: May 18, 2022

(65) Prior Publication Data

US 2023/0125691 A1 Apr. 27, 2023

(30) Foreign Application Priority Data

Oct. 26, 2021 (KR) ........................ 10-2021-0144001

(51) Int. Cl.

*H10K 59/122* (2023.01)
*H10K 59/12* (2023.01)
*H10K 59/38* (2023.01)
*H10K 59/80* (2023.01)

(Continued)

(52) U.S. Cl.

CPC ......... *H10K 59/122* (2023.02); *H10K 59/873* (2023.02); *H10K 71/00* (2023.02); *H10K 59/1201* (2023.02); *H10K 59/38* (2023.02); *H10K 59/8792* (2023.02); *H10K 2102/351* (2023.02)

(58) Field of Classification Search

CPC ..... C09G 1/02; H01L 21/3212; H01L 21/304; H01L 25/167; H10K 59/122; H10K 59/124; H10K 59/35; H10K 59/38; H10K 71/00; H10K 59/873; H10K 59/1201; H10K 59/1213; H10K 59/878; H10K 59/8792; H10D 86/60; H10D 30/6755; H10D 30/6757; H10H 20/01; H10H 20/8513; H10H 20/825; H10H 20/857

See application file for complete search history.

(56) References Cited

U.S. PATENT DOCUMENTS

| | | | | |
|---|---|---|---|---|
| 10,040,971 | B2 | 8/2018 | Hoshi et al. | |
| 2005/0253506 | A1* | 11/2005 | Tsai | H10K 59/38 313/506 |
| 2008/0036367 | A1 | 2/2008 | Eida et al. | |

(Continued)

FOREIGN PATENT DOCUMENTS

| | | |
|---|---|---|
| JP | 5087837 B2 | 9/2012 |
| KR | 1020070049172 A | 5/2007 |

(Continued)

*Primary Examiner* — Jessica S Manno
*Assistant Examiner* — Ictor Joseph Lasasso
(74) *Attorney, Agent, or Firm* — CANTOR COLBURN LLP

(57) ABSTRACT

A display apparatus includes a light-emitting element, an encapsulation layer covering the light-emitting element, a bank on the encapsulation layer and including an opening corresponding to the light-emitting element, and a quantum-dot layer in the opening of the bank. Roughness of a lower surface of the quantum-dot layer which is closest to the encapsulation layer is different from roughness of an upper surface of the quantum-dot layer which is furthest from the encapsulation layer.

9 Claims, 10 Drawing Sheets

(51) Int. Cl.
*H10K 71/00* (2023.01)
*H10K 102/00* (2023.01)

(56) References Cited

U.S. PATENT DOCUMENTS

| | | | | |
|---|---|---|---|---|
| 2017/0125740 | A1 | 5/2017 | Lee et al. | |
| 2018/0047880 | A1* | 2/2018 | Lim | H10H 20/8515 |
| 2020/0144458 | A1* | 5/2020 | Lee | H10H 20/8512 |
| 2020/0343315 | A1* | 10/2020 | Lin | H10K 59/80522 |
| 2021/0126056 | A1 | 4/2021 | Kim et al. | |
| 2022/0375844 | A1* | 11/2022 | Brun | H10W 70/65 |

FOREIGN PATENT DOCUMENTS

| | | | | |
|---|---|---|---|---|
| KR | 10-1186003 | B1 | 9/2012 | |
| KR | 20170051764 | A | 5/2017 | |
| KR | 20170121872 | A | 11/2017 | |
| WO | WO-9953532 | A1 * | 10/1999 | C09K 3/1463 |

* cited by examiner 500a
500b
500
530W1
520W1
510W1
530
630
630a
630b
520
620
620a
620b
510
610
610a
PX1
PX2
PX3
313
312
311
235a
233
231
235b
230
225a
223
221
225b
220
215a
213
211
215b
210
I
I'
500h1
600h1
400
430
420
410
305
303
150
140
131
121
110
100
Z

DISPLAY APPARATUS AND METHOD OF PROVIDING THE SAME

This application claims priority to Korean Patent Application No. 10-2021-0144001, filed on Oct. 26, 2021, and all the benefits accruing therefrom under 35 U.S.C. § 119, the disclosure of which is incorporated by reference herein in its entirety.

BACKGROUND

1. Field

One or more embodiments relate to a display apparatus and a method of manufacturing (or providing) the display apparatus. More particularly, one or more embodiments relate to a display apparatus having a simple structure and high luminous efficiency, and a method of manufacturing (or providing) the display apparatus.

2. Description of the Related Art

A display apparatus may include a plurality of pixels. For a full-color display apparatus, a plurality of pixels may emit light of different colors. For this purpose, at least some pixels of the display apparatus each include a color converter. Accordingly, light of a first color generated by an emission part of some pixels is converted to light of a second color while passing through the color converter and emitted to the outside.

SUMMARY

However, display apparatuses according to the related art have a complicated structure, and thus, have a low light efficiency.

One or more embodiments include a display apparatus having a simple structure and a high light efficiency, and a method of manufacturing (or providing) a display apparatus. However, such a technical problem is an example, and the disclosure is not limited thereto.

Additional aspects will be set forth in part in the description which follows and, in part, will be apparent from the description, or may be learned by practice of the presented embodiments of the disclosure.

According to one or more embodiments, a display apparatus includes a light-emitting element, an encapsulation layer covering the light-emitting element, a bank on the encapsulation layer and including an opening corresponding to the light-emitting element, and a quantum-dot layer in the opening of the bank. Roughness of a lower surface of the quantum-dot layer which is closest to the encapsulation layer is different from roughness of an upper surface of the quantum-dot layer which is furthest from the encapsulation layer.

The roughness of the upper surface of the quantum-dot layer may be greater than the roughness of the lower surface of the quantum-dot layer.

A root mean square of the roughness of the upper surface of the quantum-dot layer may be about 1 nanometer (nm) to about 500 nanometers (nm).

Roughness of a lower surface of the bank which is closest to the encapsulation layer may be different from roughness of an upper surface of the bank which is furthest from the encapsulation layer.

The roughness of the upper surface of the bank may be greater than the roughness of the lower surface of the bank.

A root mean square of the roughness of the upper surface of the bank may be about 1 nm to about 500 nm.

Roughness of an upper surface of the bank may be same as the roughness of the upper surface of the quantum-dot layer.

A width of an upper surface of the bank may be greater than a width of a lower surface of the bank.

A distance between the upper surface of the quantum-dot layer and an upper surface of the bank may be about 0.5 micrometer (μm) or less.

The display apparatus may further include a protective layer covering the quantum-dot layer and the bank, and a color filter layer on the protective layer.

According to one or more embodiments, a method of manufacturing (or providing) a display apparatus includes forming (or providing) a light-emitting element, forming an encapsulation layer covering the light-emitting element, forming a bank including an opening on the encapsulation layer, the opening corresponding to the light-emitting element, forming a quantum-dot layer in the opening of the bank, and reducing a height of the bank by polishing an upper surface of the bank.

The reducing of the height of the bank may include using a chemical mechanical polishing process.

The chemical mechanical polishing process may use slurry including polishing particles having a size of about 500 nm to about 5 micrometers (μm).

The chemical mechanical polishing process may use slurry including polishing particles having a weight percent (wt %) equal to or greater than about 3 wt % and equal to or less than about 5 wt %, based on 100 wt % of the slurry.

The polishing particles may include zirconia or alumina.

The reducing of the height of the bank may include simultaneously reducing the height of the bank and a height of the quantum-dot layer, such that a thickness by which the height of the bank is reduced is greater than a thickness by which the height of the quantum-dot layer is reduced.

The reducing of the height of the bank may include reducing the height of the bank such that a distance between the upper surface of the quantum-dot layer and an upper surface of the bank is about 0.5 μm or less.

The reducing of the height of the bank may include reducing the height of the bank such that a root mean square of roughness of the upper surface of the bank and an upper surface of the quantum-dot layer is in a range of about 1 nm to about 500 nm.

The reducing of the height of the bank may include reducing the height of the bank such that a root mean square of roughness of the upper surface of the bank is in a range of about 1 nm to about 500 nm.

The forming of the bank may include forming the bank such that a width of the upper surface of the bank is greater than a width of a lower surface of the bank.

These and/or other aspects will become apparent and more readily appreciated from the following description of the embodiments, the accompanying drawings, and claims.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION

Figure 1:
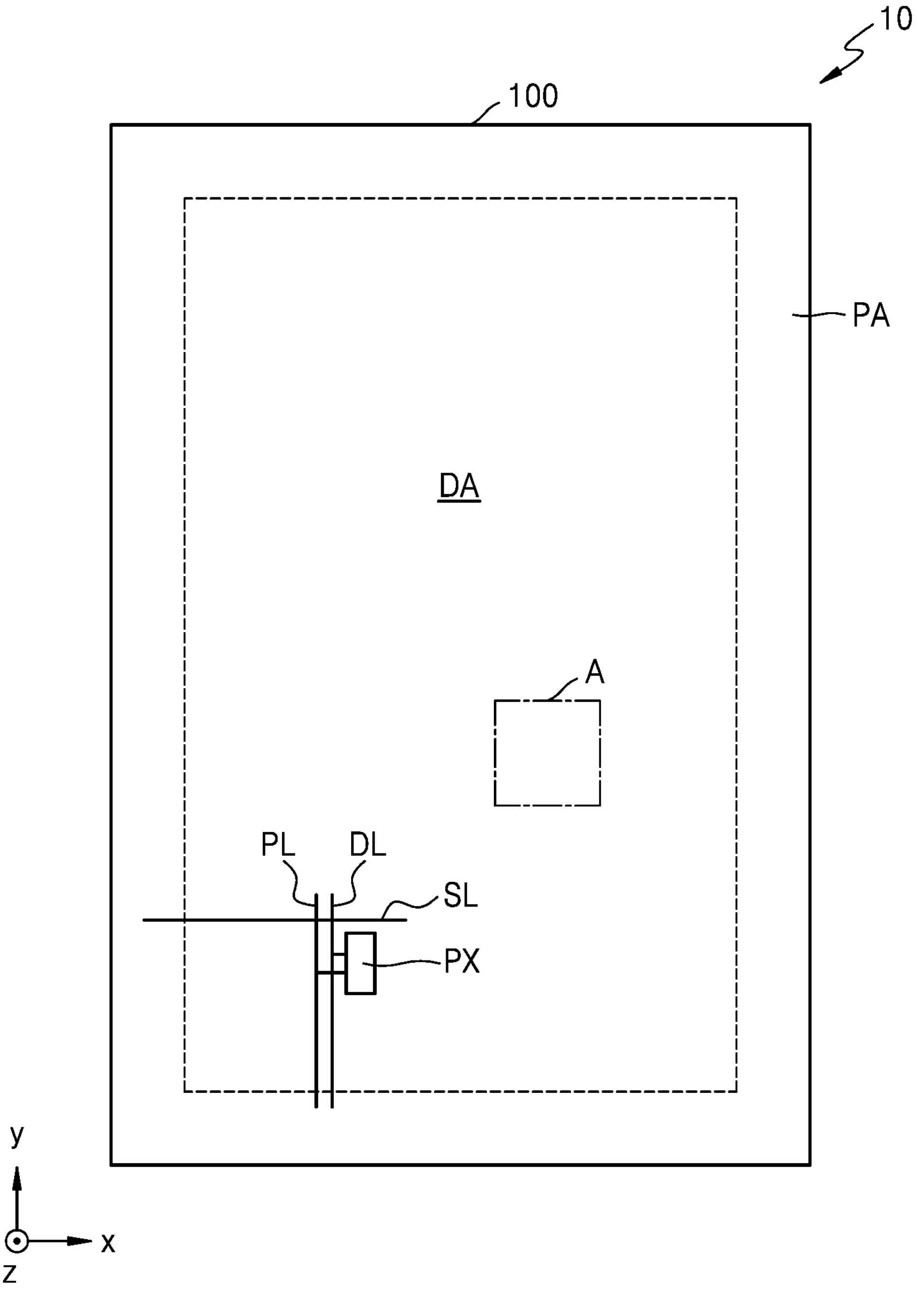
FIG. 1 is a schematic plan view of a display apparatus according to an embodiment.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

While such terms as "first" and "second" may be used to describe various components, such components must not be limited to the above terms. The above terms are used to distinguish one component from another.

The terminology used herein is for the purpose of describing particular embodiments only and is not intended to be limiting. The singular forms "a," "an," and "the" as used herein are intended to include the plural forms as well unless the context clearly indicates otherwise. For example, "an element" has the same meaning as "at least one element," unless the context clearly indicates otherwise. "At least one" is not to be construed as limiting "a" or "an." "Or" means "and/or."

It will be understood that the terms "comprise," "comprising," "include" and/or "including" as used herein specify the presence of stated features or components but do not preclude the addition of one or more other features or components.

It will be understood that, when a layer, region, or component is referred to as being related to another element such as being "on" another layer, region, or component, it can be directly or indirectly on the other layer, region, or component. That is, for example, intervening layers, regions, or components may be present. In contrast, when a layer, region, or component is referred to as being related to another element such as being "directly on" another layer, region, or component, no intervening layers, regions, or components are present.

Sizes of elements in the drawings may be exaggerated or reduced for convenience of explanation. For example, since sizes and thicknesses of elements in the drawings are arbitrarily illustrated for convenience of explanation, the disclosure is not limited thereto.

In the case where an embodiment may be implemented differently, a process order may be performed in the order different from the described order. As an example, two processes that are successively described may be substantially simultaneously performed or performed in the order opposite to the order described.

It will be understood that when a layer, region, or component is referred to as being related to another element such as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic plan view of a display apparatus according to an embodiment. As shown in FIG. 1, the display apparatus according to the present embodiment includes a display panel 10. As long as a display apparatus includes the display panel 10, any display apparatus may be employed. As an example, display apparatuses may be various apparatuses such as smartphones, tablet computers, laptop computers, televisions, advertisement boards, or the like.

The display panel 10 includes a display area DA and a peripheral area PA which is adjacent to and outside the display area DA. FIG. 1 shows that the display area DA has a rectangular shape. However, the embodiment is not limited thereto. The display area DA may have various planar shapes, for example, circular shapes, elliptical shapes, polygons, shapes of specific figures, and the like.

The display area DA is a portion or planar area that displays images, and a plurality of pixels PX may be arranged in the display area DA. Each pixel PX may include a display element such as an organic light-emitting diode. Each pixel PX may emit, for example, red, green, or blue light. The pixel PX may be connected to a pixel circuit including a thin-film transistor (TFT), a storage capacitor, and the like. The pixel circuit may be connected to a scan line SL, a data line DL, a driving voltage line PL, and the like, the scan line SL transferring scan signals, the data line DL transferring data signals, and the driving voltage line PL supplying a driving voltage. The scan line SL may extend in an x-axis direction (e.g., a first direction), and the data line DL and the driving voltage line PL may each extend in a y-axis direction (e.g., a second direction crossing the first direction).

The display element may emit light of a brightness corresponding to an electric signal from the pixel circuit electrically connected to the display element. The display area DA may be configured to display an image by using light emitted from the pixels PX. For reference, as described above, the pixel PX may be defined as an emission area that emits light of one of red, green, and blue.

The peripheral area PA is a region or a planar area in which the pixels PX are not arranged and may be a region not displaying images. A power supply line and the like may be arranged in the peripheral area PA, the power supply line driving the pixels PX. In addition, a printed circuit board or a terminal part may be arranged in the peripheral area PA, the printed circuit board including a driving circuit part, and a driver integrated circuit (IC) being connected to the terminal part.

For reference, since the display panel 10 includes a substrate 100, the substrate 100 may include the display area DA and the peripheral area PA. That is, various layers and components of the display panel 10 (or the display apparatus) may include the display area DA and the peripheral area PA corresponding to those described above.

Figure 2:
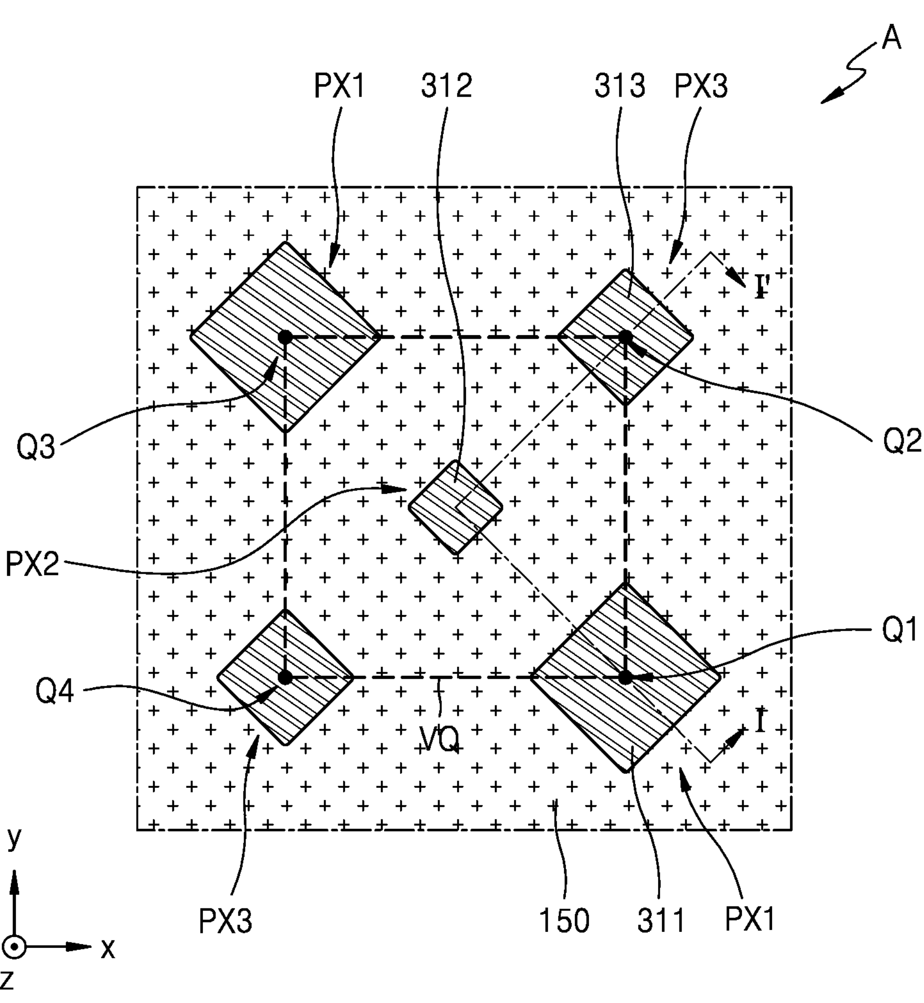
FIG. 2 is a schematic plan view of a portion of the display apparatus according to an embodiment.

FIG. 2 is a schematic plan view of a portion of the display apparatus according to an embodiment. FIG. 2 may be an enlarged plan view of a region A of FIG. 1.

As shown in FIG. 2, the display apparatus may include a plurality of pixels PX1, PX2, and PX3. The pixels PX1, PX2, and PX3 may include a first pixel PX1, a second pixel PX2, and a third pixel PX3 respectively emitting light of different colors. The first pixel PX1 may be a pixel that emits blue light, the second pixel PX2 may be a pixel that emits green light, and the third pixel PX3 may be a pixel that emits red light.

The first pixel PX1, the second pixel PX2, and the third pixel PX3 may each have a polygonal shape when viewed in a thickness direction of the display panel 10 (e.g., a z-axis direction as a third direction crossing both the first and second directions). The z-axis direction may be perpendicular to the substrate 100. It is shown in FIG. 2 that the first pixel PX1, the second pixel PX2, and the third pixel PX3 each have a quadrangular shape, specifically, a quadrangular shape having round edges when viewed in a direction (the z-axis direction) perpendicular to the substrate 100. However, the embodiment is not limited thereto. As an example, the first pixel PX1, the second pixel PX2, and the third pixel PX3 may each have a circular shape or an elliptical shape when viewed in a direction (the z-axis direction) perpendicular to the substrate 100.

The sizes and the areas (e.g., planar areas) of the first pixel PX1, the second pixel PX2, and the third pixel PX3 may be different from one another. As an example, the area of the second pixel PX2 may be less than the area of the first pixel PX1 and the area of the third pixel PX3. However, the embodiment is not limited thereto. As an example, the areas of the first pixel PX1, the second pixel PX2, and the third pixel PX3 may be substantially the same.

The first pixel PX1 may have a first pixel electrode 311, the second pixel PX2 may have a second pixel electrode 312, and the third pixel PX3 may have a third pixel electrode 313. A pixel-defining layer 150 covers the edges of each of the first pixel electrode 311, the second pixel electrode 312, and the third pixel electrode 313. That is, the pixel-defining layer 150 may have (or define) an opening that exposes the center of the first pixel electrode 311, an opening that exposes the center of the second pixel electrode 312, and an opening that exposes the center of the third pixel electrode 313. The sizes of the first pixel PX1, the second pixel PX2, and the third pixel PX3 may denote the sizes of the emission areas of the display elements implementing the pixels PX. The emission area may be defined by the opening of the pixel-defining layer 150.

The first pixel PX1 may include a light transmissive layer 610 (see FIG. 7) disposed over the first pixel electrode 311, the second pixel PX2 may include a first quantum-dot layer 620 (see FIG. 7) disposed over the second pixel electrode 312, and the third pixel PX3 may include a second quantum-dot layer 630 (see FIG. 7) disposed over the third pixel electrode 313. In FIG. 2, for convenience, the light transmissive layer 610, the first quantum-dot layer 620, the second quantum-dot layer 630, and the like may be omitted. These layers are described below.

The first pixel PX1, the second pixel PX2, and the third pixel PX3 may be arranged in a PenTile™ configuration. That is, assuming a virtual quadrangle VQ with the center of the second pixel PX2 centered within the virtual quadrangle VQ, the first pixel PX1 is arranged on a first vertex Q1, and the third pixel PX3 may be arranged on a second vertex Q2 adjacent to the first vertex Q1. In addition, the first pixel PX1 may be arranged on a third vertex Q3 arranged at a position symmetric with the first vertex Q1 with respect to the center of the virtual quadrangle VQ, and the third pixel PX3 may be arranged on a fourth vertex Q4 arranged at a position symmetric with the second vertex Q2 with respect to the center of the virtual quadrangle VQ. The virtual quadrangle VQ may have a square shape. The first pixel PX1 and the third pixel PX3 may be alternately arranged in the x-axis direction and the y-axis direction which crosses the x-axis direction. That is, as shown in FIG. 2, a set of the first pixels PX1, the second pixels PX2, and the third pixels PX3 may be repeatedly positioned in the x-axis direction and also repeatedly positioned in the y-axis direction. Accordingly, the first pixel PX1 may be surrounded by the second pixels PX2 and the third pixels PX3.

Figure 3:
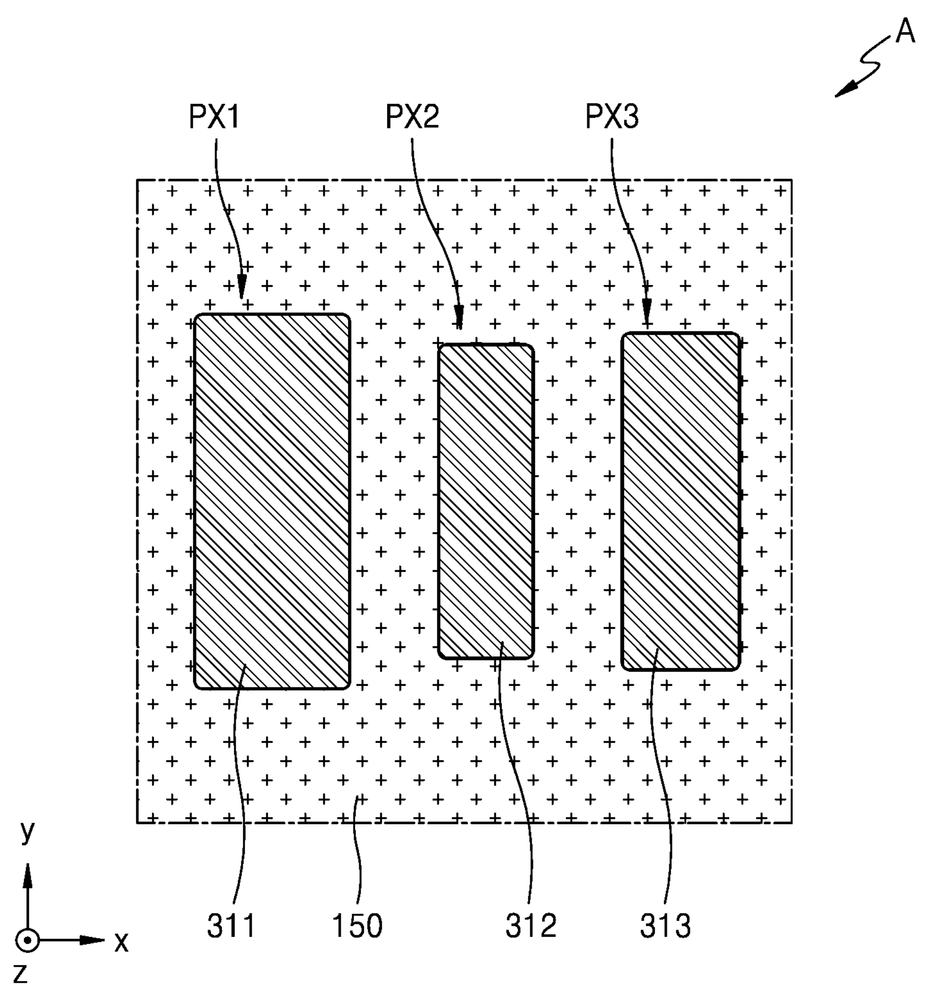
FIG. 3 is a schematic plan view of a portion of the display apparatus according to an embodiment.

However, the embodiment is not limited to the first pixel PX1, the second pixel PX2, and the third pixel PX3 arranged in the PenTile™ configuration. As an example, as shown in FIG. 3, which is a schematic plan view of a portion of the display apparatus according to an embodiment, the first pixel PX1, the second pixel PX2, and the third pixel PX3 may be arranged in a stripe configuration. That is, the first pixel PX1, the second pixel PX2, and the third pixel PX3 may be sequentially arranged in the x-axis direction. However, unlike this, the pixels PX may be arranged in a mosaic configuration.

Figure 4:
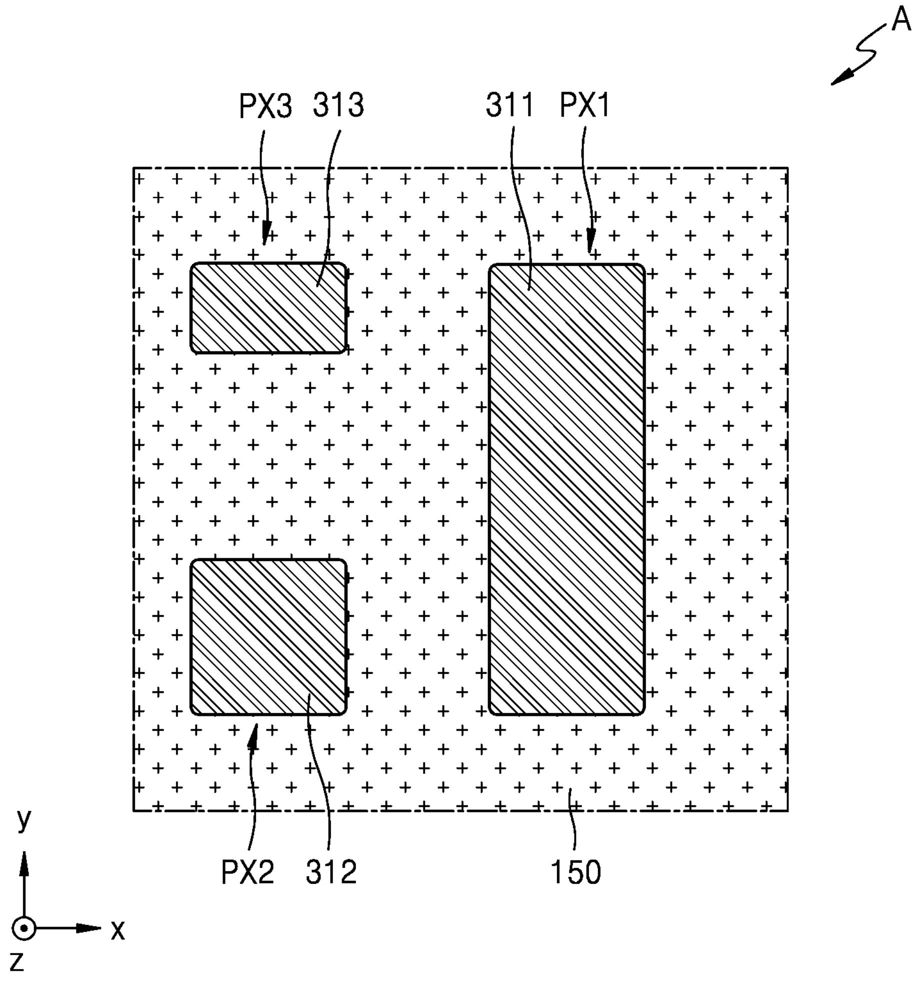
FIG. 4 is a schematic plan view of a portion of the display apparatus according to an embodiment.

In addition, as shown in FIG. 4, which is a schematic plan view of a portion of the display apparatus according to an embodiment, the first pixel PX1, the second pixel PX2, and the third pixel PX3 may be arranged in an S-stripe configuration. In this case, the second pixel PX2 and the third pixel PX3 may be alternately arranged in the y-axis direction, and a pair of pixels PX including the second pixel PX2 and third pixel PX3 may be alternately arranged with the first pixel PX1 in the x-axis direction.

Figure 5:
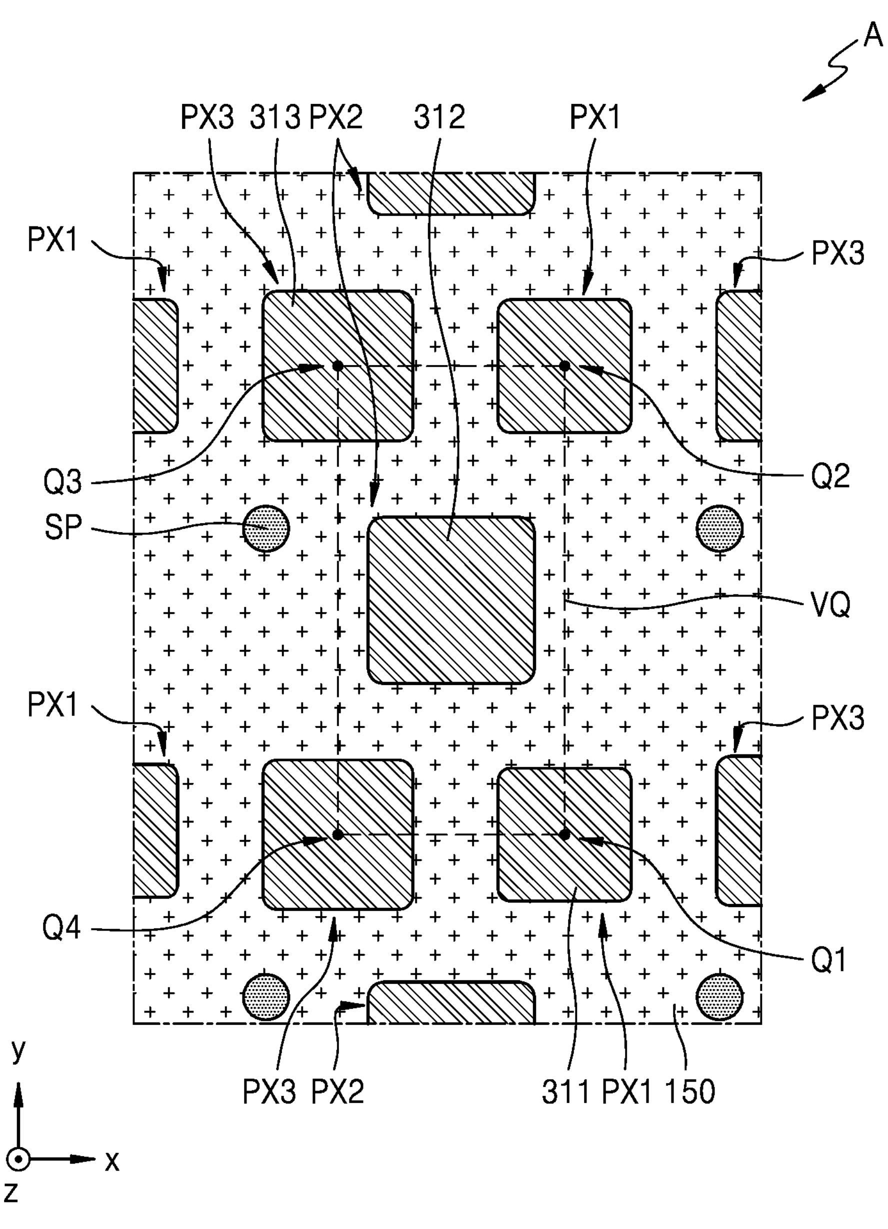
FIG. 5 is a schematic plan view of a portion of the display apparatus according to an embodiment.

However, the embodiment is not limited thereto. As an example, as shown in FIG. 5, which is a schematic plan view of a portion of the display apparatus according to an embodiment, the first pixel PX1, the second pixel PX2, and the third pixel PX3 may be arranged. The first pixel PX1 may be a pixel that emits blue light, the second pixel PX2 may be a pixel that emits green light, and the third pixel PX3 may be a pixel that emits red light.

The sizes and the areas of the first pixel PX1, the second pixel PX2, and the third pixel PX3 may be different from one another. As an example, the area of the second pixel PX2 may be greater than the area of the first pixel PX1 and the area of the third pixel PX3. However, the embodiment is not limited thereto. As an example, the areas of the first pixel PX1, the second pixel PX2, and the third pixel PX3 may be substantially the same.

The first pixel PX1 may have the first pixel electrode 311, the second pixel PX2 may have the second pixel electrode 312, and the third pixel PX3 may have the third pixel electrode 313. The pixel-defining layer 150 covers the edges of each of the first pixel electrode 311, the second pixel electrode 312, and the third pixel electrode 313.

Assuming a virtual quadrangle VQ with the center of the second pixel PX2 centered within the virtual quadrangle VQ, the first pixel PX1 may be arranged on a first vertex Q1, and the first pixel PX1 may be also arranged on a second vertex Q2 adjacent to the first vertex Q1. In addition, the third pixel PX3 may be arranged on a third vertex Q3 arranged at a position symmetric with the first vertex Q1 with respect to the center of the virtual quadrangle VQ, and the third pixel PX3 may be also arranged on a fourth vertex Q4 arranged at a position symmetric with the second vertex Q2 with respect to the center of the virtual quadrangle VQ. The virtual quadrangle VQ may have a rectangular shape. The first pixel PX1 and the third pixel PX3 may be alternately arranged in the x-axis direction. In the case of a row in which the second pixel PX2 is arranged, only the second pixels PX2 may be arranged in the x-axis direction. Pixels emitting light of the same color may be arranged in the y-axis direction crossing the x-axis direction. Accordingly, a column of the third pixels PX3 emitting red light, and a column of the first pixels PX1 emitting blue light may be alternately arranged in the x-axis direction with a column of the second pixels PX2 emitting green light respectively therebetween.

Figure 6:
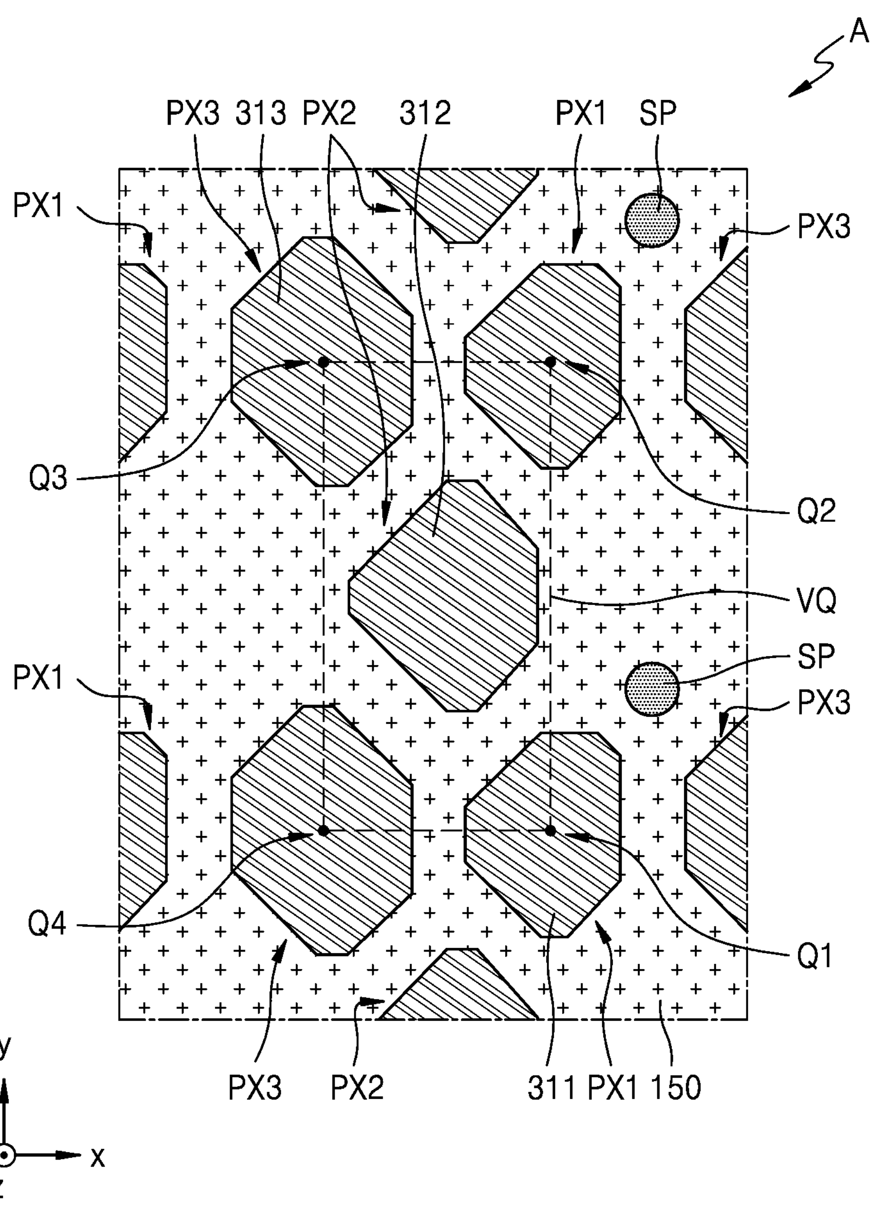
FIG. 6 is a schematic plan view of a portion of the display apparatus according to an embodiment.

It is shown in FIG. 5 that the first pixel PX1, the second pixel PX2, and the third pixel PX3 each have a quadrangular shape, specifically, a quadrangular shape having round edges when viewed in a direction (the z-axis direction) perpendicular to the substrate 100. However, the embodiment is not limited thereto. As an example, as shown in FIG. 6, which is a schematic plan view of a portion of the display apparatus according to an embodiment, the first pixel PX1, the second pixel PX2, and the third pixel PX3 may each have a quadrangular chamfered shape, that is, an octagonal shape. In this case, the degrees by which the edges are chamfered may be different from each other. That is, all the lengths of the sides of the octagon may not be the same. In addition, spacers SP may be disposed on the pixel defining layer 150 such that the spacers SP are located between the pixels.

Figure 7:
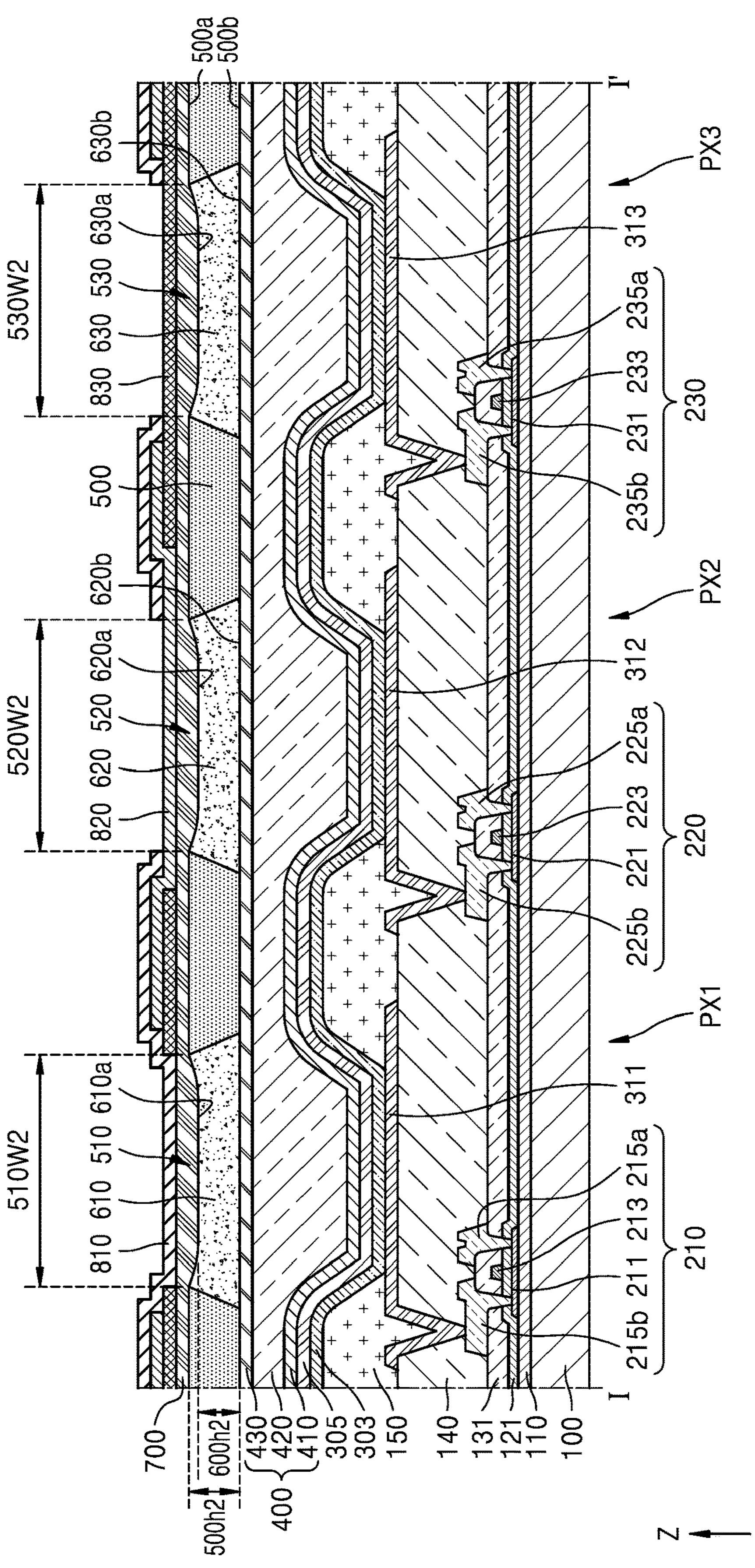
FIG. 7 is a schematic cross-sectional view of the display apparatus of FIG. 2, taken along line I-I' in FIG. 2.

FIG. 7 is a schematic cross-sectional view of the display apparatus, taken along line I-I' of FIG. 2.

The display apparatus according to the present embodiment includes the substrate 100, and the first pixel electrode 311, the second pixel electrode 312, the third pixel electrode 313, the pixel-defining layer 150, an encapsulation layer 400, a bank 500, a light transmissive layer 610, a first quantum-dot layer 620, and a second quantum-dot layer 630 on the substrate 100.

The substrate 100 may include glass, metal, or a polymer resin. The substrate 100 may include, for example, a polymer resin such as polyethersulphone, polyacrylate, polyetherimide, polyethylene naphthalate, polyethylene terephthalate, polyphenylene sulfide, polyarylate, polyimide, polycarbonate, cellulose acetate propionate, or the like. The substrate 100 may include a multi-layered structure including two layers and a barrier layer, the two layers including the polymer resin, and the barrier layer including an inorganic material (e.g., silicon oxide, silicon nitride, silicon oxynitride, and the like) interposed between the two layers. However, various modifications may be made.

The first pixel electrode 311, the second pixel electrode 312, and the third pixel electrode 313 are disposed over the substrate 100. However, in addition to the first pixel electrode 311, the second pixel electrode 312, and the third pixel electrode 313, a first thin-film transistor 210, a second thin-film transistor 220, and a third thin-film transistor 230 may be disposed over the substrate 100, the first thin-film transistor 210, the second thin-film transistor 220, and the third thin-film transistor 230 being electrically connected to the first pixel electrode 311, the second pixel electrode 312, and the third pixel electrode 313, respectively. That is, as shown in FIG. 7, the first pixel electrode 311 may be electrically connected to the first thin-film transistor 210, the second pixel electrode 312 may be electrically connected to the second thin-film transistor 220, and the third pixel electrode 313 may be electrically connected to the third thin-film transistor 230. The first pixel electrode 311, the second pixel electrode 312, and the third pixel electrode 313 may be disposed on a planarization layer 140, which is described below, over the substrate 100.

The first thin-film transistor 210 may include a first semiconductor layer 211, a first gate electrode 213, a first source electrode 215*a*, and a first drain electrode 215*b*, the first semiconductor layer 211 including amorphous silicon, polycrystalline silicon, an organic semiconductor material, or an oxide semiconductor material. The first gate electrode 213 may include various conductive materials and various layered structures, for example, a Mo layer and an Al layer. In this case, the first gate electrode 213 may have a layered structure of Mo/Al/Mo. Alternatively, the first gate electrode 213 may include a $TiN_x$ layer, an Al layer, and/or a Ti layer. The first source electrode 215*a* and the first drain electrode 215*b* may also include various conductive materials and various layered structures, for example, a Ti layer, an Al layer, and/or a Cu layer. In this case, the first source electrode 215*a* and the first drain electrode 215*b* may each have a layered structure of Ti/Al/Ti.

Though it is shown in FIG. 7 that the first thin-film transistor 210 includes both the first source electrode 215*a* and the first drain electrode 215*b*, the embodiment is not limited thereto. As an example, a source region of the first semiconductor layer 211 of the first thin-film transistor 210 may be one body with a drain region of a semiconductor layer of another thin-film transistor. In this case, the first thin-film transistor 210 may not have the first source electrode 215*a*. The first source electrode 215*a* and/or the first drain electrode 215*b* may be portions of a wiring.

For securing insulation between the first semiconductor layer 211 and the first gate electrode 213, a gate insulating layer 121 may be interposed between the first semiconductor layer 211 and the first gate electrode 213, the gate insulating layer 121 including an inorganic material such as silicon oxide, silicon nitride, and/or silicon oxynitride. An interlayer insulating layer 131 may be disposed on the first gate electrode 213, the interlayer insulating layer 131 including an inorganic material such as silicon oxide, silicon nitride, and/or silicon oxynitride. The first source electrode 215*a* and the first drain electrode 215*b* may be disposed on the interlayer insulating layer 131. The insulating layer including an inorganic material may be formed by chemical vapor deposition (CVD) or atomic layer deposition (ALD). This is true of embodiments and modifications thereof described below.

A buffer layer 110 may be interposed between the first thin-film transistor 210 having such a structure and the substrate 100, the buffer layer 110 including an inorganic material such as silicon oxide, silicon nitride, and/or silicon oxynitride. The buffer layer 110 may increase flatness of the upper surface of the substrate 100, or prevent or reduce impurities from penetrating to the first semiconductor layer 211 of the first thin-film transistor 210, the impurities being from the substrate 100 and the like.

The second thin-film transistor 220 arranged in the second pixel PX2 may include a second semiconductor layer 221, a second gate electrode 223, a second source electrode 225*a*, and a second drain electrode 225*b*. The third thin-film transistor 230 arranged in the second pixel PX3 may include a third semiconductor layer 231, a third gate electrode 233, a third source electrode 235*a*, and a third drain electrode 235*b*. Since the structure of the second thin-film transistor 220 and the structure of the third thin-film transistor 230 are the same as or similar to the first thin-film transistor 210 arranged in the first pixel PX1, descriptions thereof are omitted.

The planarization layer 140 may be disposed on the first thin-film transistor 210. As an example, as shown in FIG. 7, in the case where a light-emitting element including the first pixel electrode 311 is disposed on the first thin-film transistor 210, the planarization layer 140 covering the first thin-film transistor 210 has an approximately flat upper surface, and thus, may allow the first pixel electrode 311 and the like of the light-emitting element to be disposed on the flat surface. The planarization layer 140 may include an organic material such as acryl, benzocyclobutene (BCB), hexamethyldisiloxane (HMDSO), or the like. Though it is shown in FIG. 7 that the planarization layer 140 includes a single layer, the planarization layer 140 may include a multi-layer structure. However, various modifications may be made.

An organic light-emitting element may be arranged in the first pixel PX1, the organic light-emitting element including the first pixel electrode 311, an opposite electrode 305, and an intermediate layer 303 that is interposed therebetween and includes an emission layer. As shown in FIG. 7, the first pixel electrode 311 may be electrically connected to the first thin-film transistor 210 by contacting one of the first source electrode 215*a* and the first drain electrode 215*b* through (or at) a contact hole formed (or provided) in the planarization layer 140. The first pixel electrode 311 may include a light-transmissive conducive layer and a reflective layer, the light-transmissive conducive layer including a light-transmissive conductive oxide such as indium tin oxide (ITO), indium oxide ($In_2O_3$), indium zinc oxide (IZO), or the like, and the reflective layer including metal such as aluminum (Al), silver (Ag), or the like. As an example, the first pixel electrode 311 may have a three-layered structure of ITO/Ag/ITO.

An organic light-emitting element may be arranged in the second pixel PX2, the organic light-emitting element including the second pixel electrode 312, the opposite electrode 305, and the intermediate layer 303 that is interposed therebetween and includes the emission layer. In addition, an organic light-emitting element may be arranged in the third pixel PX3, the organic light-emitting element including the third pixel electrode 313, the opposite electrode 305, and the intermediate layer 303 that is interposed therebetween and includes the emission layer. The second pixel electrode 312 may be electrically connected to the second thin-film transistor 220 by contacting one of a second source electrode 225*a* and a second drain electrode 225*b* through a contact hole formed in the planarization layer 140. The third pixel electrode 313 may be electrically connected to the third thin-film transistor 230 by contacting one of a third source electrode 235*a* and a third drain electrode 235*b* through a contact hole formed in the planarization layer 140. The description of the first pixel electrode 311 is applicable to the second pixel electrode 312 and the third pixel electrode 313.

As described above, the intermediate layer 303 including the emission layer may be disposed not only on the first pixel electrode 311 of the first pixel PX1 but also on the second pixel electrode 312 of the second pixel PX2 and the third pixel electrode 313 of the third pixel PX3. The intermediate layer 303 may have one body that is over and corresponds to each of the first pixel electrode 311, the second pixel electrode 312, and the third pixel electrode 313. In an embodiment, the intermediate layer 303 may be patterned and respectively disposed on the first pixel electrode 311, the second pixel electrode 312, and the third pixel electrode 313 instead of having the one body.

The intermediate layer 303 may include a hole injection layer, a hole transport layer, and/or an electron transport layer. These layers of the intermediate layer 303 may have one body over each of the first pixel electrode 311, the second pixel electrode 312, and the third pixel electrode 313. Some of the layers of the intermediate layer 303 may be patterned and respectively disposed on the first pixel electrode 311, the second pixel electrode 312, and the third pixel electrode 313 in an embodiment. The emission layer of the intermediate layer 303 may emit light of a wavelength in a first wavelength band. The first wavelength band may be, for example, in a range of about 450 nanometers (nm) to about 495 nm.

The intermediate layer 303 may include a plurality of emission layers instead of one emission layer. As an example, the intermediate layer 303 may have a structure in which a first emission layer and a second emission layer are stacked along the thickness direction, and a charge-generating layer and the like are interposed between the first emission layer and the second emission layer. In this case, a hole transport layer, an electron transport layer, or the like may be interposed between the first emission layer and the charge-generating layer and between the second emission layer and the charge-generating layer, along the thickness direction.

The opposite electrode 305 on the intermediate layer 303 may also have one body over each of the first pixel electrode 311, the second pixel electrode 312, and the third pixel electrode 313. The opposite electrode 305 may include a light-transmissive conducive layer including indium tin oxide (ITO), indium oxide ($In_2O_3$), or indium zinc oxide (IZO), and include a semi-transmissive layer including metal such as aluminum (Al), lithium (Li), magnesium (Mg), ytterbium (Yb), silver (Ag), or the like. As an example, the opposite electrode 305 may include a semi-transmissive layer including MgAg, AgYb, Yb/MgAg, or Li/MgAg.

The pixel-defining layer 150 may be disposed on the planarization layer 140. The pixel-defining layer 150 has an opening defined therein corresponding to each of the pixels PX. That is, the pixel-defining layer 150 covers the edges of each of the first pixel electrode 311, the second pixel electrode 312, and the third pixel electrode 313, and includes an opening that exposes the central portion of the first pixel electrode 311, an opening that exposes the central portion of the second pixel electrode 312, and an opening that exposes the central portion of the third pixel electrode 313. The pixel-defining layer 150 may define the pixels PX. In addition, as shown in FIG. 7, the pixel-defining layer 150 may prevent electrical arcs and the like from occurring at the edges of the first pixel electrode 311, the second pixel electrode 312, and the third pixel electrode 313 by increasing a distance between the edges of each of the first pixel electrode 311, the second pixel electrode 312 and the third pixel electrode 313, and the opposite electrode 305, respectively. The pixel-defining layer 150 may include an organic material, for example, polyimide, hexamethyldisiloxane (HMDSO), or the like.

The organic light-emitting elements may be easily deteriorated by moisture, oxygen, or the like, the organic light-emitting elements each including the first pixel electrode 311, the second pixel electrode 312 and the third pixel electrode 313, each together with the intermediate layer 303 including the emission layer, and the opposite electrode 305. Accordingly, to protect the organic light-emitting elements from external moisture, oxygen, or the like, the display apparatus may include the encapsulation layer 400 covering the organic light-emitting elements.

The encapsulation layer 400 may include at least one inorganic encapsulation layer and at least one organic encapsulation layer. As an example, the encapsulation layer 400 may include a first inorganic encapsulation layer 410, a second inorganic encapsulation layer 430 facing the first inorganic encapsulation layer 410, and an organic encapsulation layer 420 between the first inorganic encapsulation layer 410 and the second inorganic encapsulation layer 430.

The first inorganic encapsulation layer 410 and the second inorganic encapsulation layer 430 may each include at least one inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO or $ZnO_2$), and be formed by chemical vapor deposition (CVD). The organic encapsulation layer 420 may include a polymer-based material. The polymer-based material may include an acryl-based resin (e.g., polymethylmethacrylate, poly acrylic acid, and the like), an epoxy-based resin, polyimide, and polyethylene.

Since the first inorganic encapsulation layer 410 formed by the chemical vapor deposition has an approximately uniform thickness, the upper surface of the first inorganic encapsulation layer 410 is not flat as shown in FIG. 7. However, the organic encapsulation layer 420 has an approximately flat upper surface, and thus, the second inorganic encapsulation layer 430 on the organic encapsulation layer 420 may also have an approximately flat upper surface.

The bank 500 (e.g., bank layer), the light transmissive layer 610, the first quantum-dot layer 620, and the second quantum-dot layer 630 may be disposed on the encapsulation layer 400. The bank 500, the light transmissive layer 610, the first quantum-dot layer 620 and the second quantum-dot layer 630 may together provide a light control layer.

The bank 500 includes (or defines) a first opening 510, a second opening 520 and a third opening 530. The openings of the bank 500 may correspond to the light-emitting elements. Specifically, the first opening 510 of the bank 500 corresponds to an opening of the pixel-defining layer 150 that exposes the first pixel electrode 311, the second opening 520 of the bank 500 corresponds to an opening of the pixel-defining layer 150 that exposes the second pixel electrode 312, and the third opening 530 of the bank 500 corresponds to an opening of the pixel-defining layer 150 that exposes the third pixel electrode 313. That is, when viewed in a direction (a z-axis direction) perpendicular to the substrate 100, the first opening 510 of the bank 500 overlaps the opening of the pixel-defining layer 150 that exposes the first pixel electrode 311, the second opening 520 of the bank 500 overlaps the opening of the pixel-defining layer 150 that exposes the second pixel electrode 312, and the third opening 530 of the bank 500 overlaps the opening of the pixel-defining layer 150 that exposes the third pixel electrode 313. Accordingly, when viewed in a direction (the z-axis direction) perpendicular to the substrate 100, the shapes of the edges of each of the first to third openings 510, 520, and 530 of the bank 500 may be the same as or similar to the shapes of the edges of each of the openings of the pixel-defining layer 150 corresponding thereto. As described above, the first opening 510 of the bank 500 corresponds to the first pixel electrode 311, the second opening 520 of the bank 500 corresponds to the second pixel electrode 312, and the third opening 530 of the bank 500 corresponds to the third pixel electrode 313.

The bank 500 may include various materials and include an inorganic material such as silicon oxide, silicon nitride, and/or silicon oxynitride. In an embodiment, the bank 500 may include a photoresist material. Through this, the bank 500 may be formed by carrying out exposure and developing processes and the like. The area of the upper surface of the bank 500 may be greater than the area of the lower surface of the bank 500, the area being a product of dimensions of the bank 500 along a plane, such as a plane defined by the x-axis direction and the y-axis direction crossing each other. Accordingly, as shown in FIG. 7, it may be shown in a cross-sectional view that the bank 500 has an inversely tapered shape. That is, in a direction along a surface of the substrate 100, an upper surface width of the bank 500 may be greater than a lower surface width of the bank 500, to define the inverse taper shape.

In the first pixel PX1, light generated from the intermediate layer 303 including the emission layer and having a wavelength belonging to the first wavelength band (e.g., first light), may pass through the encapsulation layer 400 without wavelength conversion and be emitted to outside the encapsulation layer 400. Accordingly, the light transmissive layer 610 including a light transmissive resin may be disposed in the first opening 510 of the bank 500 that overlaps the first pixel electrode 311. Depending on the case, unlike FIG. 7, the light transmissive layer 610 may be excluded from inside the first opening 510 of the bank 500. The light transmissive layer 610 may include a light transmissive resin and scatterers.

For the scatterers of the light transmissive layer 610, as long as scatterers includes a material that may form an optical interface between the scatterers and the light transmissive resin and partially scatter transmission light, the material of the scatterers is not particularly limited. In an embodiment, for example, the scatterers may include metal oxide particles or organic particles. For metal oxide for scatterers, titanium oxide ($TiO_2$), zirconium oxide ($ZrO_2$), aluminum oxide ($Al_2O_3$), indium oxide ($In_2O_3$), zinc oxide ($ZnO$ or $ZnO_2$), tin oxide ($SnO_2$), or the like may be used. For an organic material for scatterers, an acryl-based resin, a urethane-based resin, or the like may be used. The scatterers may scatter light in various directions regardless of an incident angle while not substantially converting the wavelength of incident light. Through this, the scatterers may improve lateral visibility of the display apparatus.

For the light transmissive resin of the light transmissive layer 610, as long as a light transmissive material has excellent dispersion characteristics with respect to the scatterers, any material may be used. As an example, a polymer resin such as an acryl-based resin, an imide-based resin, an epoxy-based resin, benzocyclobutene (BCB), or hexamethyldisiloxane (HMDSO) may be used as the light transmissive resin of the light transmissive layer 610. A material for forming the light transmissive layer 610, which is a combination of the light transmissive resin and the scatterers, may be disposed in the first opening 510 of the bank 500 that overlaps the first pixel electrode 311 by inkjet printing.

The first quantum-dot layer 620 may be disposed in the second opening 520 of the bank 500. When viewed in a direction (the z-axis direction) perpendicular to the substrate 100, the first quantum-dot layer 620 may overlap the second pixel electrode 312. The first quantum-dot layer 620 may convert light of a wavelength in the first wavelength band (e.g., first light) that passes through the first quantum-dot layer 620, into light of a wavelength in a second wavelength band (e.g., second light). The second wavelength band may be in a range of, for example, about 495 nm to about 570 nm. However, the embodiment is not limited thereto and the wavelength band to which the wavelength converted by the first quantum-dot layer 620 belongs, and the wavelength band to which the wavelength after the conversion belongs may be modified differently.

The first quantum-dot layer 620 may have a configuration in which quantum dots are dispersed in a resin. In the present embodiment, embodiments described below, and modified embodiments thereof, the quantum dots denote crystals of a semiconductor compound, and may include an arbitrary material that may emit light in various light emission wavelengths depending on the size of the crystals. The diameter of the quantum dot may be, for example, about 1 nanometer (nm) to about 10 nm.

The quantum dot may be synthesized by a wet chemical process, a metal organic chemical vapor deposition process, a molecular beam epitaxy process, or a similar process. The wet chemical process is a method of mixing an organic solvent and a precursor material, and then, growing quantum dot particle crystals. In the wet chemical process, while crystals grow, since an organic solvent naturally acts as a dispersant coordinated on the surface of the quantum dot crystal and controls the growth of the crystal, the wet chemical process is easier than vapor depositions such as metal organic chemical vapor deposition (MOCVD), molecular beam epitaxy (MBE), or the like. In addition, the wet chemical process is a process of low costs and may control the growth of the quantum dot particles.

The quantum dot may be one of a Group II-Group VI semiconductor compound, a Group III-Group V semiconductor compound, a Group III-Group VI semiconductor compound, a Group I-Group III-Group VI semiconductor compound, a Group IV-Group VI semiconductor compound, a Group IV element or compound, and an arbitrary combination thereof.

A group II-group VI semiconductor compound may include: one of a two-element compound including one of CdSe, CdTe, ZnS, ZnSe, ZnTe, ZnO, HgS, HgSe, HgTe, MgSe, and MgS; a three-element compound including one of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS; and a four-element compound including one of CdZnSeS, CdZnSeTe, CdZnSTe, CdHgSeS, CdHgSeTe, CdHgSTe, HgZnSeS, HgZnSeTe, and HgZnSTe, or an arbitrary combination thereof.

A Group Ill-group V semiconductor compound may include: one of a two-element compound including one of GaN, GaP, GaAs, GaSb, AlN, AlP, AlAs, AlSb, InN, InP, InAs, and InSb; a three-element compound including one of GaNP, GaNAs, GaNSb, GaPAs, GaPSb, AlNP, AlNAs, AlNSb, AlPAs, AlPSb, InGaP, InNP, InNAs, InNSb, InPAs, and InPSb; and a four-element compound including one of GaAlNAs, GaAlNP, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb, or an arbitrary combination thereof. The Group III-Group V semiconductor compound may further include a Group II element. A Group III-Group V semiconductor compound further including a Group II element may include one of InZnP, INGaZnP, and InAlZnP.

A Group III-Group VI semiconductor compound may include: one of a two-element compound including one of GaS, GaSe, GazSes, GaTe, InS, $In_2S_3$, InSe, $In_2Se_3$, and InTe; and a three-element compound including one of AgInS, $AgInS_2$, CuInS, $CuInS_2$, $InGaS_3$, and InGaSes, or an arbitrary combination thereof.

A Group I-Group III-Group VI semiconductor compound may include one of a three-element compound including AgInS, $AgInS_2$, CuInS, $CuInS_2$, $CuGaO_2$, $AgGaO_2$ and $AgAlO_2$, or an arbitrary combination thereof.

A Group IV-Group VI semiconductor compound may include: one of a two-element compound including one of SnS, SnSe, SnTe, PbS, PbSe, and PbTe; a three-element compound including one of SnSeS, SnSeTe, SnSTe, PbSeS, PbSeTe, PbSTe, SnPbS, SnPbSe, and SnPbTe; and a four-element compound including one of SnPbSSe, SnPbSeTe, and SnPbSTe, or an arbitrary combination thereof.

A Group IV element or compound may include one of a single-element compound including one of Si and Ge; and a two-element compound including one of SiC and SiGe, or an arbitrary combination thereof.

Each element included in multi-element compound such as the two-element compound, the three-element compound, and the four-element compound may be present inside a particle at a uniform concentration or a non-uniform concentration.

The quantum dot may have a single structure in which the concentration of each element included in the relevant quantum dot is uniform, or a double structure of a core-shell. As an example, a material included in a core may be different from a material included in a shell. A shell of the quantum dot may serve as a protection layer for maintaining semiconductor characteristics by preventing chemical modification of a core, and/or serve as a charging layer for giving electrophoretic properties to the quantum dot.

The shell may include a single layer or a multi-layer. An interface between the core and the shell may have a concentration gradient in which the concentration of an element existing in the shell reduces toward the center.

Examples of the shell of the quantum dot may include oxide of metal or non-metal, a semiconductor compound, or a combination thereof. Oxide of metal or non-metal may include one of a two-element compound including one of $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO; and a three-element compound including one of $MgAl_2O_4$, $CoFe_2O_4$, $NiFe_2O_4$, and $CoMn_2O_4$, or an arbitrary combination thereof. The semiconductor compound may be one of a Group II-Group VI semiconductor compound, a Group III-Group V semiconductor compound, a Group III-Group VI semiconductor compound, a Group I-Group III-Group VI semiconductor compound, a Group IV-Group VI semiconductor compound, and an arbitrary combination thereof. As an example, a semiconductor compound may include one of CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and an arbitrary combination thereof.

The quantum dot may have a full width of half maximum (FWHM) of emission wavelength spectrum in a range of about 45 nm or less, such as about 40 nm or less, or about 30 nm or less, and improve color purity or color reproduction in this range. In addition, since light emitted through the quantum dots is emitted in all directions, an angle of view of light may be improved.

In addition, specifically, the shape of the quantum dots may be a circular shape, a pyramid shape, a multi-arm or cubic shape, a nano particle, a nanotube, a nanowire, a nanofiber, a nano plate particle, or the like.

Since an energy band gap may be adjusted by adjusting the size of the quantum dot, light in various wavelength bands may be obtained from a quantum-dot emission layer. Accordingly, since quantum dots of different sizes are used, a light-emitting element that emits light in various wavelengths may be implemented. Specifically, the size of the quantum dot may be selected such that red, green, and/or blue light is emitted. In addition, the size of the quantum dot may be configured such that light of various colors are combined to emit white light.

The first quantum-dot layer 620 may include scatterers. Since incident light is scattered by the scatterers of the first quantum-dot layer 620, the incident light may be efficiently converted by the quantum dots inside the first quantum-dot layer 620. As long as the scatterer includes a material that may form an optical interface between the scatterer and the light transmissive resin and partially scatter transmitted light, the material is not particularly limited. The description of the material for the scatterers of the light transmissive layer 610 is applicable to the material for the scatterers of the first quantum-dot layer 620. The scatterers may scatter light in various directions regardless of an incident angle while not substantially converting the wavelength of incident light. Through this, the scatterers may improve lateral visibility of the display apparatus. In addition, the first quantum-dot layer 620 may increase a light-converting efficiency by increasing a probability that light incident to the first quantum-dot layer 620 meets the quantum dots.

For the resin of the first quantum-dot layer 620, as long as a light transmissive material has excellent dispersion characteristics with respect to the scatterers, any material may be used. As an example, a polymer resin such as an acryl-based resin, an imide-based resin, an epoxy-based resin, benzocyclobutene (BCB), or hexamethyldisiloxane (HMDSO) may be used as a material for forming the first quantum-dot layer 620. A material for forming the first quantum-dot layer 620 including the resin and the scatterers, may be disposed in the second opening 520 of the bank 500 that overlaps the second pixel electrode 312 by inkjet printing.

The second quantum-dot layer 630 may be disposed in the third opening 530 of the bank 500. When viewed in a direction (the z-axis direction) perpendicular to the substrate 100, the second quantum-dot layer 630 may overlap the third pixel electrode 313.

The second quantum-dot layer 630 may convert light of a wavelength in the first wavelength band (e.g., first light) that passes through the second quantum-dot layer 630 into light of a wavelength in a third wavelength band (e.g., third light). The third wavelength band may be in a range of, for example, about 625 nm to about 780 nm. However, the embodiment is not limited thereto and the wavelength band to which the wavelength converted by the second quantum-dot layer 630 belongs, and the wavelength band to which the wavelength after the conversion belongs may be modified differently.

The second quantum-dot layer 630 may have a configuration in which quantum dots are dispersed in a resin. In the present embodiment, embodiments described below, and modified embodiments thereof, the quantum dots denote crystals of a semiconductor compound, and may include an arbitrary material that may emit light in various light emission wavelengths depending on the size of the crystals. The diameter of the quantum dot may be, for example, about 1 nm to about 10 nm. Since the description of the quantum dots included in the first quantum-dot layer 620 is applicable to the quantum dots included in the second quantum-dot layer 630, the description of the quantum dots included in the second quantum-dot layer 630 is omitted.

The second quantum-dot layer 630 may include scatterers. Since incident light is scattered by the scatterers of the second quantum-dot layer 630, the incident light may be efficiently converted by the quantum dots inside the second quantum-dot layer 630. For the scatterers, as long as scatterers include a material that may form an optical interface between the scatterers and the light transmissive resin and partially scatter transmission light, the material of the scatterers is not particularly limited. In an embodiment, for example, the scatterers may include metal oxide particles or organic particles. Metal oxide for the scatterers and an organic material for the scatterers are the same as described above. The scatterers may scatter light in various directions regardless of an incident angle while not substantially converting the wavelength of incident light. Through this, the scatterers may improve lateral visibility of the display apparatus. In addition, the second quantum-dot layer 630 may increase a light-converting efficiency by increasing a probability that light incident to the second quantum-dot layer 630 meets the quantum dots.

For the resin of the second quantum-dot layer 630, as long as a light transmissive material has excellent dispersion characteristics with respect to the scatterers, any material may be used. As an example, a polymer resin such as an acryl-based resin, an imide-based resin, an epoxy-based resin, benzocyclobutene (BCB), or hexamethyldisiloxane (HMDSO) may be used as a material for forming the second quantum-dot layer 630. A material for forming the second quantum-dot layer 630 including the resin and the scatterers, may be disposed in the third opening 530 of the bank 500 that overlaps the third pixel electrode 313 by inkjet printing.

To protect the light transmissive layer 610, the first quantum-dot layer 620, and the second quantum-dot layer 630, the display apparatus may include a protective layer 700 covering an upper surface 610*a* of the light transmissive layer 610, an upper surface 620*a* of the first quantum-dot layer 620, and an upper surface 630*a* of the second quantum-dot layer 630 as shown in FIG. 7. The protective layer 700 may include an inorganic material such as silicon oxide, silicon nitride, silicon oxynitride, and the like, and be formed by chemical vapor deposition (CVD). In an embodiment, the protective layer 700 may have a two-layered structure including a silicon oxide layer and a silicon nitride layer.

The protective layer 700 including the inorganic material may directly contact the upper surface 610*a* of the light transmissive layer 610, the upper surface 620*a* of the first quantum-dot layer 620, the upper surface 630*a* of the second quantum-dot layer 630, and an upper surface 500*a* of the bank 500 (e.g., bank upper surface). An interface may be formed between the protective layer 700 and the various upper surfaces listed above.

Each of the patterns in the light control layer may have a thickness along the z-axis direction, to define a respective pattern height. As described below, in the display apparatus, a second height 600*h*2 at the central portion of each of the light transmissive layer 610, the first quantum-dot layer 620 and the second quantum-dot layer 630 may be substantially the same as a second height 500*h*2 of the bank 500, or a difference thereof is not large. Accordingly, instead of forming a planarizing layer including an organic material and covering the light transmissive layer 610, the first quantum-dot layer 620, the second quantum-dot layer 630 and the bank 500 to provide a flat upper surface, and then arranging the protective layer 700 on the planarizing layer, the protective layer 700 including an inorganic material may be disposed in direct contact with the upper surfaces of the light control layer at each of the light transmissive layer 610, the first quantum-dot layer 620, the second quantum-dot layer 630 and the bank 500.

In an embodiment, the planarizing layer including the organic material and covering the light transmissive layer 610, the first quantum-dot layer 620, the second quantum-dot layer 630 and the bank 500 such that the planarizing layer has the flat upper surface may be formed, and then, the protective layer 700 may be disposed on the planarizing layer. In this case, in the display apparatus, since the second height 600*h*2 at the central portion of each of the light transmissive layer 610, the first quantum-dot layer 620, and the second quantum-dot layer 630 may be substantially the same as the second height 500*h*2 of the bank 500, or a difference thereof is not large, the thickness of the planarizing layer may be remarkably made thin. As an example, the thickness of the planarizing layer may be made twice or less than the difference between the second height 600*h*2 at the central portion of each of the light transmissive layer 610, the first quantum-dot layer 620, and the second quantum-dot layer 630 and the second height 500*h*2 of the bank 500. This is true of embodiments and modifications thereof described below.

Color filter layers may be disposed on the protective layer 700. A first color filter layer 810 may be disposed over the light transmissive layer 610, a second color filter layer 820 may be disposed over the first quantum-dot layer 620, and a third color filter layer 830 may be disposed over the second quantum-dot layer 630. The first color filter layer 810 may be a layer (or pattern) that transmits only light of a wavelength in a range of about 450 nm to about 495 nm. The second color filter layer 820 may be a layer that transmits only light of a wavelength in a range of about 495 nm to about 570 nm. The third color filter layer 830 may be a layer that transmits only light of a wavelength in a range of about 625 nm to about 780 nm.

The first color filter layer 810, the second color filter layer 820, and the third color filter layer 830 may together form a color filter layer and improve the quality of images displayed by improving color purity of light emitted to outside the display panel 10. In addition, the first color filter layer 810, the second color filter layer 820, and the third color filter layer 830 may reduce external light reflection by reducing a ratio at which external light incident to the display apparatus from the outside is reflected by the first pixel electrode 311, the second pixel electrode 312, and the third pixel electrode 313, and then emitted to the outside again. In an embodiment, a black matrix may be interposed between the first color filter layer 810, the second color filter layer 820, and the third color filter layer 830 arranged in a direction along the protective layer 700.

As shown in FIG. 7, the first color filter layer 810 includes a first filter opening corresponding to the first quantum-dot layer 620. The first filter opening of the first color filter layer 810 may define a region of the second pixel PX2. The second color filter layer 820 may fill at least the first filter opening of the first color filter layer 810. As shown in FIG. 7, the first color filter layer 810 includes a second filter opening corresponding to the second quantum-dot layer 630. The second filter opening of the first color filter layer 810 may define a region of the third pixel PX3. The third color filter layer 830 may fill at least the second filter opening of the first color filter layer 810. The third color filter layer 830 includes a third filter opening corresponding to the light transmissive layer 610. The third filter opening of the third color filter layer 830 may define a region of the first pixel PX1. The first color filter layer 810 fills at least the third filter opening of the third color filter layer 830. That is, an overlying color filter layer defines respective openings to expose one or more of an underlying color filter layer, to outside the overlying color filter layer.

Portions where two or more color filter layers overlap each other may serve as a black matrix. As an example, in the case where the first color filter layer 810 transmits only light of a wavelength in a range of about 450 nm to about 495 nm, and the second color filter layer 820 transmits only light of a wavelength in a range of about 495 nm to about 570 nm, there is no light that may pass through both the first color filter layer 810 and the second color filter layer 820 in the portion where the first color filter layer 810 overlaps the second color filter layer 820, theoretically. When all of the first color filter layer 810, the second color filter layer 820, and the third color filter layer 830 include an overlapping portion between the first pixel PX1, the second pixel PX2, and the third pixel PX3, the overlapping portions of the color filter layers may serve as black matrixes between the first pixel PX1, the second pixel PX2, and the third pixel PX3.

In the display apparatus according to the present embodiment, the roughness of a lower surface 620*b* of the first quantum-dot layer 620 which is closest to the encapsulation layer 400 is different from the roughness of the upper surface 620*a* of the first quantum-dot layer 620 which is furthest from the encapsulation layer 400. Specifically, the roughness of the upper surface 620*a* of the first quantum-dot layer 620 is greater than the roughness of the lower surface 620*b*. As described below, to reduce a difference between the height of the first quantum-dot layer 620 at the central portion of the first quantum-dot layer 620 and the height of the bank 500 by reducing the height of the bank 500, chemical mechanical polishing (CMP) is carried out, in which the upper surface of the first quantum-dot layer 620 is chemical-mechanical polished during a process thereof. Consequently, the roughness of the upper surface 620*a* of the first quantum-dot layer 620 (as a polished upper surface) becomes greater than the roughness of the lower surface 620*b*.

In the case where the roughness of the upper surface 620*a* of the first quantum-dot layer 620 is greater than the roughness of the lower surface 620*b*, light generated from the light-emitting element, passing through the first quantum-dot layer 620, and progressing to the outside may progress in various directions while passing through the surface having the relatively larger roughness. As a result, a viewing angle of the display apparatus may be remarkably widened. A root mean square (RMS) of the roughness of the upper surface 620*a* of the first quantum-dot layer 620 may be in a range of about 1 nm to about 500 nm.

In the case where a root mean square (RMS) of the roughness of the upper surface 620*a* of the first quantum-dot layer 620 is less than about 1 nm, a difference between the height of the first quantum-dot layer 620 at the central portion of the first quantum-dot layer 620 and the height of the bank 500 cannot be reduced to a numerical value set in advance or less. In this case, the protective layer 700 cannot be disposed directly on the light transmissive layer 610, the first quantum-dot layer 620, the second quantum-dot layer 630, and the bank 500. Instead, the planarizing layer covering the light transmissive layer 610, the first quantum-dot layer 620, the second quantum-dot layer 630, and the bank 500 and having an approximately flat upper surface is additionally formed, and then the protective layer 700 is disposed on the planarizing layer. As a result, the number of layers through which light generated from the light-emitting element should pass increases, and thus, a light efficiency of the display apparatus is reduced. In the case where a root mean square (RMS) of the roughness of the upper surface 620*a* of the first quantum-dot layer 620 is about 500 nm, the height of the first quantum-dot layer 620 at the central portion of the first quantum-dot layer 620 becomes substantially the same as the height of the bank 500. Accordingly, in the case where a root mean square (RMS) of the roughness of the upper surface 620*a* of the first quantum-dot layer 620 exceeds 500 nm, an effect of reducing a difference between the height of the first quantum-dot layer 620 at the central portion of the first quantum-dot layer 620 and the height of the bank 500 does not appear, and the amount of materials used in the manufacturing process is excessive unnecessarily. Accordingly, a root mean square (RMS) of the roughness of the upper surface 620*a* of the first quantum-dot layer 620 may be in a range of about 1 nm to about 500 nm.

A difference between the height of the first quantum-dot layer 620 at the central portion of the first quantum-dot layer 620 and the height of the bank 500 may be about 0.5 micrometer (μm) or less.

The roughness of a lower surface 500*b* of the bank 500 (e.g., bank lower surface) which is closest to the encapsulation layer 400 may be different from the roughness of an upper surface 500*a* of the bank 500 which is furthest from the encapsulation layer 400. Specifically, the roughness of the upper surface 500*a* of the bank 500 may be greater than the roughness of the lower surface 500*b*. As described below, since, to reduce a difference between the height of the first quantum-dot layer 620 at the central portion of the first quantum-dot layer 620 and the height of the bank 500 by reducing the height of the bank 500, chemical mechanical polishing (CMP) is carried out, consequently, the roughness of the upper surface 500*a* of the bank 500 becomes greater than the roughness of the lower surface 500*b*.

As described above, a root mean square (RMS) of the roughness of the upper surface 620*a* of the first quantum-dot layer 620 may be in a range of about 1 nm to about 500 nm. A root mean square (RMS) of the roughness of the upper surface 500*a* of the bank 500 polished together with the first quantum-dot layer 620 may be also in a range of about 1 nm to about 500 nm. That is, the roughness of the upper surface 500*a* of the bank 500 may be the same as the roughness of the upper surface 620*a* of the first quantum-dot layer 620.

Hereinafter, a method of manufacturing (or providing) a display apparatus is described with reference to FIGS. 8 and 9. FIG. 10 is a schematic cross-sectional view of a portion of the display apparatus according to an embodiment.

The light-emitting element is formed over the substrate 100, the encapsulation layer 400 covering the light-emitting element is formed, and then an insulating material layer for forming the bank 500 is formed on the encapsulation layer 400. The insulating material layer for forming the bank 500 may include various materials and include an inorganic material such as silicon oxide, silicon nitride, and/or silicon oxynitride. In an embodiment, the insulating material layer for forming the bank 500 may include a photoresist material. The bank 500 may be formed such that the area of the upper surface 500*a* is greater than the area of the lower surface 500*b*. Accordingly, as shown in FIG. 8, it may be shown in a cross-sectional view that the bank 500 has an inversely tapered shape.

Figure 8:
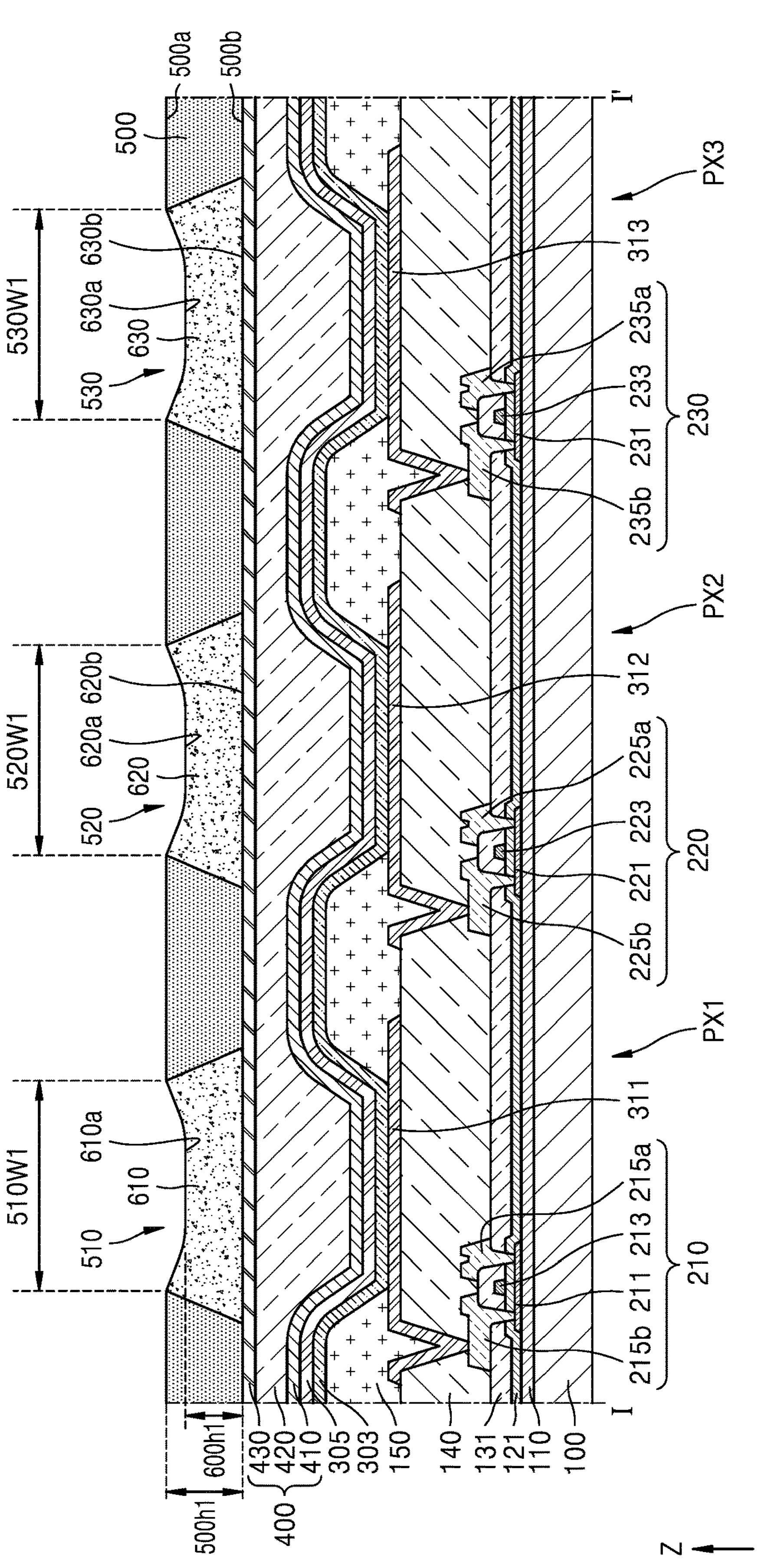
FIGS. 8 and 9 are schematic cross-sectional views showing a process of manufacturing (or providing) the display apparatus of FIG. 7.

Subsequently, as shown in FIG. 8, the bank 500 is formed by forming the first opening 510, the second opening 520, and the third opening 530. The openings of the bank 500 may respectively correspond to the light-emitting elements. Specifically, the first opening 510 of the bank 500 corresponds to an opening of the pixel-defining layer 150 that exposes the first pixel electrode 311, the second opening 520 of the bank 500 corresponds to an opening of the pixel-defining layer 150 that exposes the second pixel electrode 312, and the third opening 530 of the bank 500 corresponds to an opening of the pixel-defining layer 150 that exposes the third pixel electrode 313. That is, when viewed in a direction (a z-axis direction) perpendicular to the substrate 100, the first opening 510 of the bank 500 overlaps the opening of the pixel-defining layer 150 that exposes the first pixel electrode 311, the second opening 520 of the bank 500 overlaps the opening of the pixel-defining layer 150 that exposes the second pixel electrode 312, and the third opening 530 of the bank 500 overlaps the opening of the pixel-defining layer 150 that exposes the third pixel electrode 313. Accordingly, when viewed in a direction (the z-axis direction) perpendicular to the substrate 100, the shapes of the edges of each of the first to third openings 510, 520, and 530 of the bank 500 may be the same as or similar to the shapes of the edges of each of the openings of the pixel-defining layer 150 corresponding thereto. As described above, the first opening 510 of the bank 500 corresponds to the first pixel electrode 311, the second opening 520 of the bank 500 corresponds to the second pixel electrode 312, and the third opening 530 of the bank 500 corresponds to the third pixel electrode 313.

Then, the light transmissive layer 610 is formed by arranging a material for forming the light transmissive layer 610, which is a combination of the light transmissive resin and the scatterers, inside the first opening 510 of the bank 500 that overlaps the first pixel electrode 311 by using inkjet printing. In addition, the first quantum-dot layer 620 is formed by arranging a material for forming the first quantum-dot layer 620, which is a combination of the first quantum dots, the scatterers, and a resin inside the second opening 520 of the bank 500 that overlaps the second pixel electrode 312 by using inkjet printing. Likewise, the second quantum-dot layer 630 is formed by arranging a material for forming the second quantum-dot layer 630, which is a combination of the second quantum dots, the scatterers, and a resin inside the third opening 530 of the bank 500 that overlaps the third pixel electrode 313 by using inkjet printing. The order of forming the light transmissive layer 610, the first quantum-dot layer 620, and the second quantum-dot layer 630 may be changed.

During a process of forming the light transmissive layer 610, the first quantum-dot layer 620, and the second quantum-dot layer 630 by using inkjet printing, the first height **500*h*1 of the bank 500 may be sufficiently high such that the relevant material does not overflow to the outside of the openings of the bank 500. As shown in FIG. 8, since the central portion of each of the light transmissive layer 610, the first quantum-dot layer 620, and the second quantum-dot layer 630 is lower than the edges thereof which are closest to the bank 500, the upper surface 610*a* of the light transmissive layer 610, the upper surface 620*a* of the first quantum-dot layer 620, and the upper surface 630*a* of the second quantum-dot layer 630 have a concave shape defined by the central portion together with the edge portion of the respective upper surfaces. Since the first height 500*h*1 of the bank 500 is sufficiently high, a difference between the heights at the central portion of each of the light transmissive layer 610, the first quantum-dot layer 620, and the second quantum-dot layer 630, and the first height 500*h*1 of the bank 500** is considerably large.

Accordingly, in the method of manufacturing (or providing) the display apparatus, providing reduction of the height of the bank 500 by polishing the upper surface **500*a* of the bank 500 provides a second height 500*h*2 which is smaller than the first height 500*h*1. An operation of reducing the height of the bank 500 may include using a chemical mechanical polishing (CMP) process. The operation of reducing the height of the bank 500 may include an operation of simultaneously reducing the heights of the light transmissive layer 610, the first quantum-dot layer 620, and the second quantum-dot layer 630, where a size (e.g., thickness) by which the height of the bank 500 is reduced is greater than a size (e.g., thickness) by which the heights of the light transmissive layer 610, the first quantum-dot layer 620, and the second quantum-dot layer 630 are reduced. That is, a second height 600*h*2 is smaller than the first height 600*h*1**.

Figure 9:
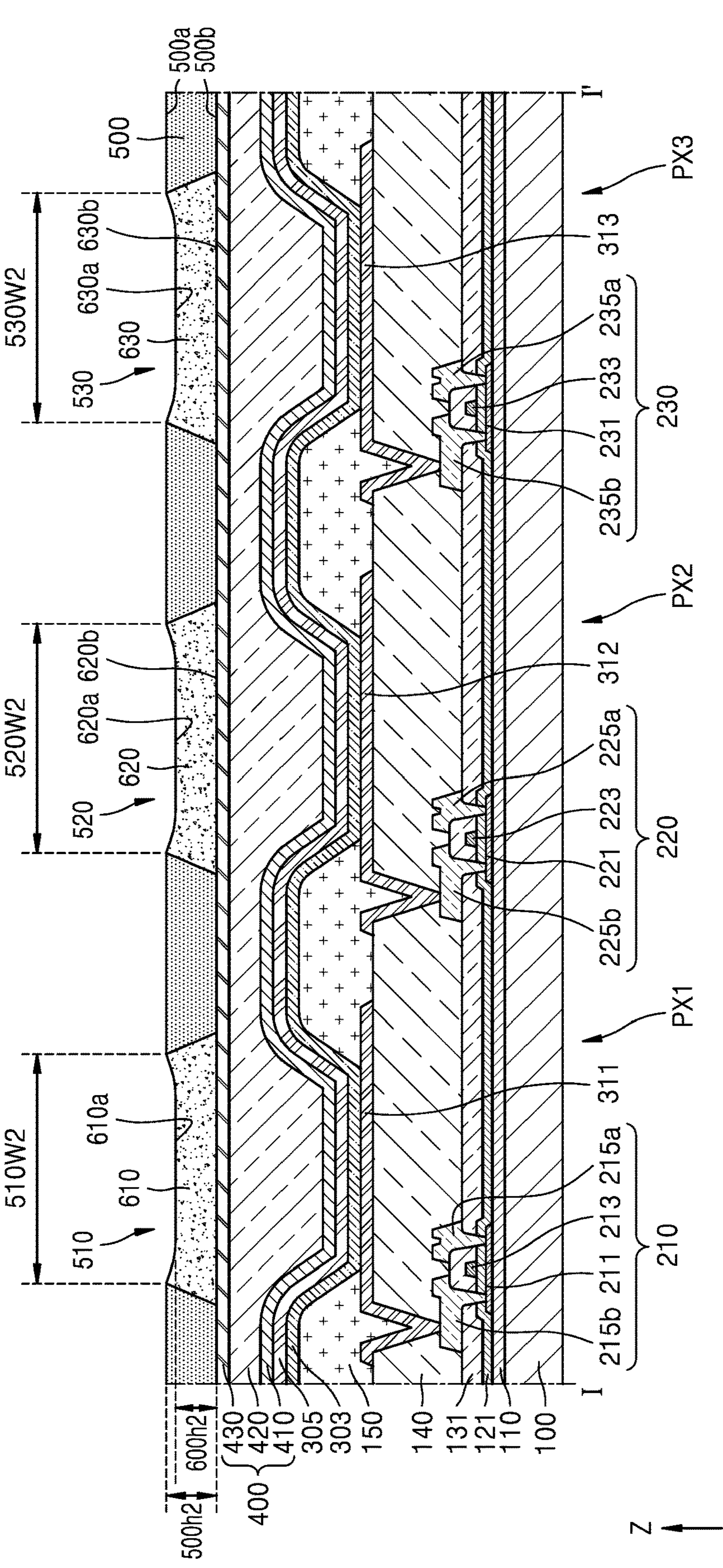
Figure 10:
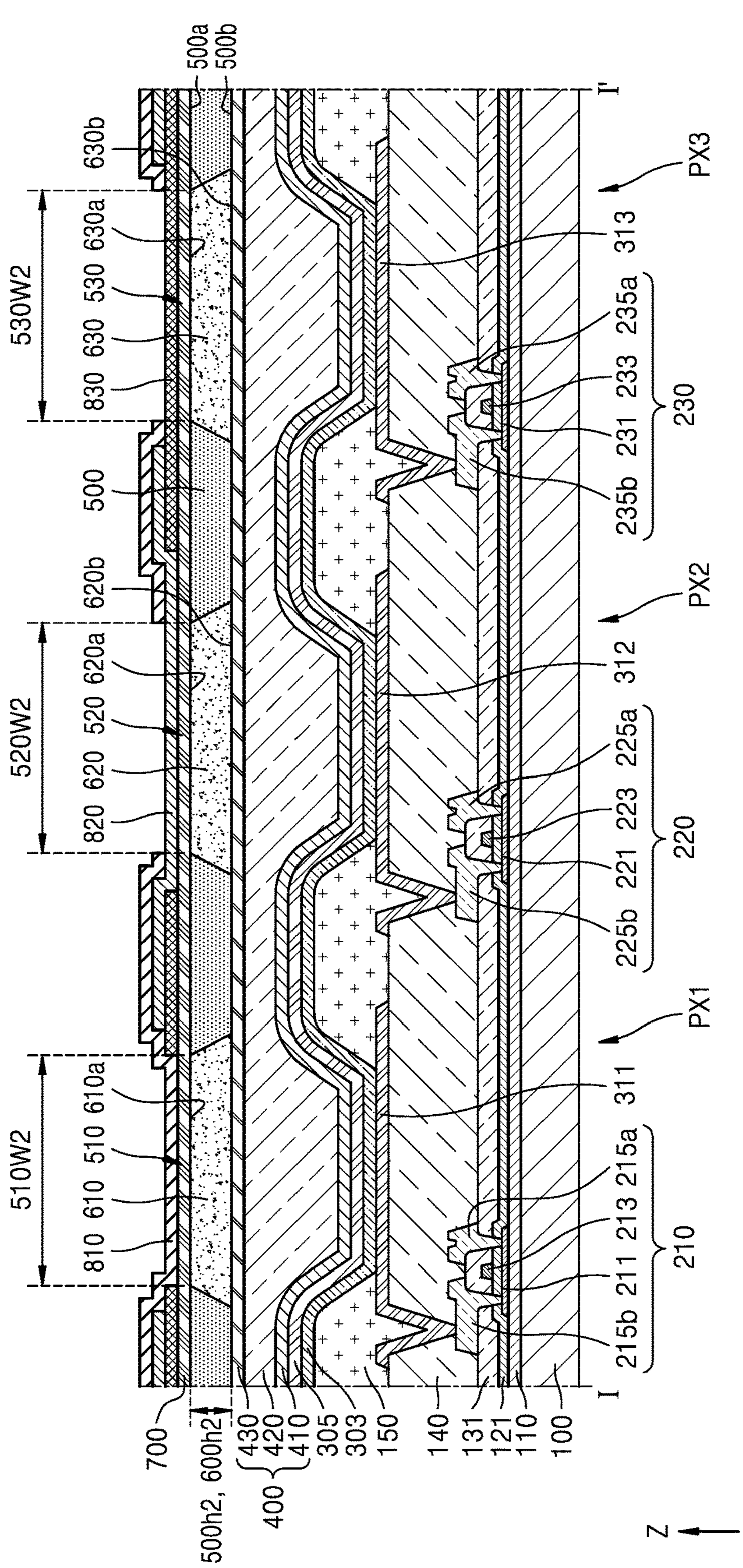
FIG. 10 is a schematic cross-sectional view of a portion of the display apparatus according to an embodiment.

Accordingly, as shown in FIG. 9, a difference between the second height **600*h*2 of the central portion of the light transmissive layer 610, the first quantum-dot layer 620 and the second quantum-dot layer 630, and the second height 500*h*2 of the bank 500, becomes less than a difference between the first height 600*h*1 of the central portion of the light transmissive layer 610, the first quantum-dot layer 620 and the second quantum-dot layer 630 and the first height 500*h*1 of the bank 500. As a result, the planarizing layer including an organic material, covering the bank 500, the light transmissive layer 610, the first quantum-dot layer 620, and the second quantum-dot layer 630, and including the flat upper surface is obviated. Instead, as shown in FIG. 7, the protective layer 700 may be directly formed on upper surfaces of the bank 500, the light transmissive layer 610, the first quantum-dot layer 620 and the second quantum-dot layer 630** by using an inorganic material. With this structure, the number of layers through which light generated from the light-emitting element passes is reduced, and thus, a light efficiency of the display apparatus may be remarkably increased. An effect of simplifying the structure of the display apparatus may be also obtained.

A difference between the second height **600*h*2 of the central portion of each of the first quantum-dot layer 620 and the second quantum-dot layer 630, and the second height 500*h*2 of the bank 500, that is, a respective distance between the upper surface 620*a* of the first quantum-dot layer 620 and the upper surface 630*a* of the second quantum-dot layer 630, and the upper surface 500*a* of the bank 500**, may be made about 0.5 μm or less.

Since the first color filter layer 810, the second color filter layer 820, and the third color filter layer 830 described above with reference to FIG. 7 are formed on the protective layer 700, when a distance between the upper surface **620*a* of the first quantum-dot layer 620 and the upper surface 630*a* of the second quantum-dot layer 630, and the upper surface 500*a* of the bank 500 is greater than about 0.5 μm, the dispersion of the thickness of the color filter layers rapidly increases during a process of forming the color filter layers. As an example, when a difference between the second height 600*h*2 of the central portion of each of the first quantum-dot layer 620 and the second quantum-dot layer 630, and the second height 500*h*2 of the bank 500, that is, a distance between the upper surface 620*a* of the first quantum-dot layer 620 and the upper surface 630*a* of the second quantum-dot layer 630, and the upper surface 500*a* of the bank 500, is about 0.5 μm or less, the dispersion of the thickness of the color filter layer may be maintained at about 4.5% or less. However, when a difference between the second height 600*h*2 of the central portion of each of the first quantum-dot layer 620 and the second quantum-dot layer 630, and the second height 500$h$2 of the bank 500, that is, a distance between the upper surface 620$a$ of the first quantum-dot layer 620 and the upper surface 630$a$ of the second quantum-dot layer 630, and the upper surface 500$a$ of the bank 500** is about 2.5 μm, the dispersion of the thickness of the color filter layer rapidly increases to about 33.9%.

The increased dispersion of the thickness of the color filter layer means that the thickness of the color filter layer may vary in pixels emitting light in the same wavelength band. This means that defects in which stain patterns appear in images displayed by the display apparatus may occur. Accordingly, in one or more embodiment, a difference between the second height 600$h$2 of the central portion of each of the first quantum-dot layer 620 and the second quantum-dot layer 630, and the second height 500$h$2 of the bank 500, that is, a distance between the upper surface 620$a$ of the first quantum-dot layer 620 and the upper surface 630$a$ of the second quantum-dot layer 630, and the upper surface 500$a$ of the bank 500, is made about 0.5 μm or less.

The chemical mechanical polishing process may use slurry including polishing particles having a size of about 500 nm to about 5 μm. When the size of the polishing particles is greater than about 5 μm, a root mean square of the roughness of the upper surface 620$a$ of the first quantum-dot layer 620 excessively increases and exceeds 500 nm. When the size of the polishing particles is less than about 500 nm, an excessive time is consumed for polishing, and thus, time consumed in manufacturing the display apparatus may rapidly increase. The polishing particles may include zirconia or alumina. For reference, the operation of reducing the height of the bank 500 may be an operation of reducing the height such that a root mean square of the roughness of the upper surface 620$a$ of the first quantum-dot layer 620, the upper surface 630$a$ of the second quantum-dot layer 630, and the upper surface 500$a$ of the bank 500 is in a range of about 1 nm to about 500 nm. Since the reason a root mean square of the roughness of the upper surface 620$a$ of the first quantum-dot layer 620, the upper surface 630$a$ of the second quantum-dot layer 630, and the upper surface 500$a$ of the bank 500 is in this range is described above, description thereof is omitted.

The chemical mechanical polishing operation may be an operation of using slurry including polishing particles having weight percent (wt %) equal to or greater than about 3 wt % and equal to or less than about 5 wt %, with respect to a 100 wt % of the slurry. When the weight percent of the polishing particles in the slurry is less than about 3 wt %, the amount of polishing particles is small, and thus, planarization is not performed properly. When the weight percent of the polishing particles in the slurry exceeds 5 wt %, defects in which polishing particles aggregate may occur. In addition, the slurry used in the chemical mechanical polishing process may not be swiftly supplied on the upper surface 500$a$ of the bank 500.

By polishing the upper surface 500$a$ of the bank 500 and reducing the height of the bank 500, a light extraction efficiency may also be increased. As shown in FIG. 8, the area of the upper surface 500$a$ of the bank 500 is greater than the area of the lower surface 500$b$. That is, as shown in FIG. 8, it may be shown in a cross-sectional view that the bank 500 has an inversely tapered shape. In this case, when first opening widths 510W1, 520W1, and 530W1 of the first opening 510, the second opening 520, and the third opening 530 of the bank 500 are not sufficiently large, a ratio at which light generated from the light-emitting elements passes through the first opening 510, the second opening 520, and the third opening 530 and is extracted to the outside is reduced. However, when the height of the bank 500 is lowered from the first height 500$h$1 shown in FIG. 8 to the second height 500$h$2 shown in FIG. 9 by polishing the upper surface 500$a$ of the bank 500, an effect that first opening widths 510W1, 520W1, and 530W1 of the first opening 510, the second opening 520, and the third opening 530 of the bank 500 increase to second opening widths 510W2, 520W2, and 530W2, may be also obtained. As a result, a light extraction efficiency that light generated from the light-emitting elements passes through the first opening 510, the second opening 520, and the third opening 530 and is extracted to the outside may be remarkably increased.

It is shown in FIGS. 7 and 9 that the second height 600$h$2 of the central portion of each of the light transmissive layer 610, the first quantum-dot layer 620 and the second quantum-dot layer 630 is different from the second height 500$h$2 of the bank 500. However, the embodiment is not limited thereto. As described above, while the height of the bank 500 is reduced (FIG. 9) by polishing the upper surface 500$a$ of the bank 500 from the state as shown in FIG. 8, the height of the bank 500 and the heights of the light transmissive layer 610, the first quantum-dot layer 620 and the second quantum-dot layer 630 may be simultaneously reduced such that a size by which the height of the bank 500 is reduced is greater than a size by which the heights of the light transmissive layer 610, the first quantum-dot layer 620 and the second quantum-dot layer 630 are reduced. In this case, by performing the polishing for a sufficient time, as shown in FIG. 10, which is a schematic cross-sectional view of a portion of the display apparatus according to an embodiment, the second height 600$h$2 of the central portion of each of the light transmissive layer 610, the first quantum-dot layer 620 and the second quantum-dot layer 630 may be substantially the same as the second height 500$h$2 of the bank 500.

According to one or more embodiment of the present disclosure having the above configuration, the display apparatus with a simple structure and high light efficiency may be implemented. However, the scope of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of providing a display apparatus, the method comprising:

providing a light-emitting element;

providing an encapsulation layer covering the light-emitting element;

providing a bank which defines an opening in the bank, on the encapsulation layer, wherein the bank has a height taken from the encapsulation layer, the bank includes a bank upper surface which is furthest from the encapsulation layer and has a roughness, and the opening corresponds to the light-emitting element;

providing a quantum-dot layer in the opening of the bank; and increasing the roughness of the bank upper surface of the bank by a chemical mechanical polishing process, wherein the chemical mechanical polishing process further provides reduction of the height of the bank.

2. The method of claim 1, wherein the chemical mechanical polishing process in the polishing of the bank upper surface uses slurry including polishing particles having a size of about 500 nanometers to about 5 micrometers together with the polishing particles having weight percent equal to or greater than about 3 weight percent and equal to or less than about 5 weight percent with respect to 100 weight percent of the slurry.

3. The method of claim 1, wherein the quantum-dot layer which is provided in the opening of the bank includes an upper surface which is furthest from the encapsulation layer and has a roughness, and the providing of the reduction of the height of the bank further provides an increase of the roughness of the upper surface of the quantum-dot layer.

4. The method of claim 2, wherein the polishing particles include zirconia or alumina.

5. The method of claim 1, wherein the quantum-dot layer has a height taken from the encapsulation layer, and the providing of the reduction of the height of the bank includes simultaneously reduces the height of the quantum-dot layer by a thickness and reduces the height of the bank by a thickness which is greater than the thickness by which the height of the quantum-dot layer is reduced.

6. The method of claim 1, wherein the quantum-dot layer includes an upper surface which is furthest from the encapsulation layer, and the providing of the reduction of the height of the bank includes reducing the height of the bank such that a distance between the upper surface of the quantum-dot layer and the bank upper surface of the bank is about 0.5 micrometer or less.

7. The method of claim 3, wherein the providing of the reduction of the height of the bank includes defining a root mean square of the roughness of the bank upper surface of the bank and a root mean square of the roughness of the upper surface of the quantum-dot layer in a range of about 1 nanometer to about 500 nanometers.

8. The method of claim 1, wherein the providing of the reduction of the height of the bank includes defining a root mean square of the roughness of the bank upper surface of the bank in a range of about 1 nanometer to about 500 nanometers.

9. The method of claim 1, wherein the providing of the light-emitting element includes providing the light-emitting element over a substrate, the bank upper surface has a width along a surface of the substrate, and the polishing of the bank upper surface of the bank further provides a decrease of the width of the bank upper surface.

* * * * *